United States Patent
Hagino

(10) Patent No.: US 10,326,256 B2
(45) Date of Patent: Jun. 18, 2019

(54) SURFACE EMITTING LASER AND ATOMIC OSCILLATOR

(71) Applicant: Seiko Epson Corporation, Tokyo (JP)

(72) Inventor: Takashi Hagino, Fujimi (JP)

(73) Assignee: Seiko Epson Corporation (JP)

( * ) Notice: Subject to any disclaimer, the term of this patent is extended or adjusted under 35 U.S.C. 154(b) by 107 days.

(21) Appl. No.: 15/683,056

(22) Filed: Aug. 22, 2017

(65) Prior Publication Data

US 2018/0062349 A1 Mar. 1, 2018

(30) Foreign Application Priority Data

Aug. 29, 2016 (JP) .................................. 2016-167102

(51) Int. Cl.
*H01S 5/068* (2006.01)
*H01S 5/183* (2006.01)
*H03L 7/26* (2006.01)
*G04F 5/14* (2006.01)
(Continued)

(52) U.S. Cl.
CPC ............ *H01S 5/06821* (2013.01); *G04F 5/14* (2013.01); *H01S 5/183* (2013.01); *H01S 5/18355* (2013.01); *H01S 5/3201* (2013.01); *H03L 7/26* (2013.01); *H01S 5/02276* (2013.01); *H01S 5/0425* (2013.01); *H01S 5/187* (2013.01);
(Continued)

(58) Field of Classification Search
CPC .. H01S 5/06821; H01S 5/183; H01S 5/18355; H01S 5/3201; H01S 5/02276; H01S 5/0425; H01S 5/18308; H01S 5/18352; H01S 5/187; H01S 5/34313; H01S 2301/176
See application file for complete search history.

(56) References Cited

U.S. PATENT DOCUMENTS 102,864 A * 5/1870 Reed ........................ E05B 39/00
116/76
6,134,251 A 10/2000 Kawase et al.
(Continued)

FOREIGN PATENT DOCUMENTS

JP 11-054838 A 2/1999
JP 2009-272394 A 11/2009
(Continued)

*Primary Examiner* — Armando Rodriguez
(74) *Attorney, Agent, or Firm* — Harness, Dickey & Pierce, P.L.C.

(57) ABSTRACT

A surface emitting laser includes a substrate, a stacked structure provided on the substrate and including a resonator and a first distortion applier connected to the resonator and applying distortion to the active layer, and a second distortion applier provided on the substrate and applying distortion to the active layer. As seen from a stacking direction, the first distortion applier has a first portion and a second portion provided with the resonator in between, as seen from the stacking direction, a longitudinal direction of the second distortion applier and a longitudinal direction of the first distortion applier are the same direction, and a magnitude relationship of a linear expansion coefficient of the second distortion applier to a linear expansion coefficient of the substrate is the same as a magnitude relationship of a linear expansion coefficient of the first distortion applier to the linear expansion coefficient of the substrate.

11 Claims, 13 Drawing Sheets

(51) Int. Cl.
*H01S 5/32* (2006.01)
*H01S 5/187* (2006.01)
*H01S 5/343* (2006.01)
*H01S 5/022* (2006.01)
*H01S 5/042* (2006.01)

(52) U.S. Cl.
CPC ....... *H01S 5/18308* (2013.01); *H01S 5/18352* (2013.01); *H01S 5/34313* (2013.01); *H01S 2301/176* (2013.01)

(56) References Cited

U.S. PATENT DOCUMENTS

| | | |
|---|---|---|
| 2009/0274414 A1 | 11/2009 | Numata |
| 2015/0180204 A1 | 6/2015 | Takenaka et al. |
| 2015/0180205 A1 | 6/2015 | Kaneko et al. |
| 2015/0180207 A1 | 6/2015 | Kaneko et al. |
| 2015/0180208 A1 | 6/2015 | Kaneko et al. |
| 2015/0180212 A1 | 6/2015 | Nishida et al. |
| 2015/0180213 A1 | 6/2015 | Takenaka et al. |
| 2015/0180214 A1* | 6/2015 | Nishida .................. G04F 5/145 372/107 |

FOREIGN PATENT DOCUMENTS

| | | |
|---|---|---|
| JP | 2015-119136 A | 6/2015 |
| JP | 2015-119137 A | 6/2015 |
| JP | 2015-119138 A | 6/2015 |
| JP | 2015-119142 A | 6/2015 |
| JP | 2015-119143 A | 6/2015 |
| JP | 2015-119147 A | 6/2015 |

\* cited by examiner

SURFACE EMITTING LASER AND ATOMIC OSCILLATOR

CROSS-REFERENCE TO RELATED APPLICATIONS

This application claims priority to Japanese Patent Application No. 2016-167102, filed Aug. 29, 2016, the entirety of which is hereby incorporated by reference.

BACKGROUND

1. Technical Field

The present invention relates to a surface emitting laser and an atomic oscillator.

2. Related Art

A surface emitting laser (VCSEL: Vertical Cavity Surface Emitting Laser) is used as e.g. a light source for an atomic oscillator utilizing CPT (Coherent Population Trapping) as one of quantum interference effects.

In the surface emitting laser, generally, a resonator has an isotropic structure and control of the polarization direction of the laser beam output from the resonator is difficult. As a technique of controlling the polarization direction of the laser beam, for example, JP-A-2015-119143 discloses a technology of stabilizing the polarization direction of the laser beam by providing a distortion applier that applies anisotropic distortion to an active layer. The surface emitting laser in JP-A-2015-119143 has a stacked structure including the distortion applier and a resonator that resonates light generated in the active layer, and the distortion applier is provided and the shape of the stacked structure has a longitudinal direction in the plan view. The shape of the stacked structure has the longitudinal direction and anisotropic distortion may be applied to the active layer, and accordingly, the polarization direction of the laser beam may be controlled.

However, in the technique in JP-A-2015-119143, it maybe hard to apply sufficient distortion to the active layer and the polarization direction of the laser beam may be unstable. For example, when the surface emitting laser is operated at a high temperature, the anisotropic distortion applied to the active layer by the distortion applier may be relaxed and the polarization direction of the laser beam may be unstable.

SUMMARY

An advantage of some aspects of the invention is to provide a surface emitting laser that may make stability of the polarization direction of the laser beam higher than that in related art. Another advantage of some aspects of the invention is to provide an atomic oscillator including the above described surface emitting laser.

A surface emitting laser according to an aspect of the invention includes a substrate, a stacked structure having a resonator that resonates light generated in the active layer and a first distortion applier connected to the resonator and applying distortion to the active layer, and provided on the substrate, and a second distortion applier provided on the substrate and applying distortion to the active layer, wherein the stacked structure has the active layer and a first mirror layer and a second mirror layer sandwiching the active layer, as seen from a stacking direction of the first mirror layer and the active layer, the first distortion applier includes a first portion and a second portion projecting from the resonator in opposite directions to each other, as seen from the stacking direction, a longitudinal direction of the second distortion applier and a longitudinal direction of the first distortion applier are the same direction, and a magnitude relationship of a linear expansion coefficient of the second distortion applier to a linear expansion coefficient of the substrate is the same as a magnitude relationship of a linear expansion coefficient of the first distortion applier to the linear expansion coefficient of the substrate.

In the surface emitting laser, the longitudinal direction of the second distortion applier and the longitudinal direction of the first distortion applier are the same direction, and the magnitude relationship of the linear expansion coefficient of the second distortion applier to the linear expansion coefficient of the substrate is the same as the magnitude relationship of the linear expansion coefficient of the first distortion applier to the linear expansion coefficient of the substrate. Accordingly, the second distortion applier may apply distortion having the same anisotropy as that of the first distortion applier to the active layer. Therefore, in the surface emitting laser, for example, compared to a surface emitting laser without the second distortion applier, stability of a polarization direction of a laser beam may be made higher.

In the surface emitting laser according to the aspect of the invention, the second distortion applier may be apart from the stacked structure.

In the surface emitting laser with this configuration, the second distortion applier is apart from the stacked structure, and thereby, distortion may be applied to the active layer without change in shape of the stacked structure.

In the surface emitting laser according to the aspect of the invention, a plurality of the second distortion appliers may be provided.

In the surface emitting laser with this configuration, for example, compared to the case where only one second distortion applier is provided, larger distortion may be applied to the active layer and the stability of the polarization direction of the laser beam may be made even higher.

In the surface emitting laser according to the aspect of the invention, as seen from the stacking direction, the plurality of the second distortion appliers may be arranged in a direction orthogonal to the longitudinal direction of the first distortion applier.

In the surface emitting laser with this configuration, for example, compared to the case where the plurality of second distortion appliers are arranged in the longitudinal direction of the first distortion applier, the size of the substrate may be made smaller in the longitudinal direction of the first distortion applier. For example, in the case where the plurality of second distortion appliers are arranged in the longitudinal direction of the first distortion applier, the longitudinal direction of the second distortion applier and the arrangement direction of the second distortion applier become the same and the size of the substrate becomes larger in the longitudinal direction of the first distortion applier.

In the surface emitting laser according to the aspect of the invention, as seen from the stacking direction, when the substrate is divided into a first region and a second region at a boundary of a virtual line passing through a center of the resonator and extending in the longitudinal direction of the first distortion applier, part of the plurality of the second distortion appliers maybe located in the first region and the other part of the plurality of the second distortion appliers may be located in the second region.

In the surface emitting laser with this configuration, for example, compared to the case where the second distortion appliers are located in only one region, distortion with better symmetry may be applied to the active layer.

In the surface emitting laser according to the aspect of the invention, a number of the second distortion appliers located in the first region and a number of the second distortion appliers located in the second region may be equal.

In the surface emitting laser with this configuration, for example, compared to the case where the number of second distortion appliers located in the first region and the number of second distortion appliers located in the second region are different, distortion with better symmetry may be applied to the active layer.

In the surface emitting laser according to the aspect of the invention, as seen from the stacking direction, in the direction orthogonal to the longitudinal direction of the first distortion applier, a distance between the second distortion applier and an end portion of the substrate may be smaller than a distance between the second distortion applier and the stacked structure.

In the surface emitting laser with this configuration, a space can be formed between the second distortion applier and the stacked structure, and, for example, an electrode for injection of a current to the active layer may be provided in the space. Thereby, a current path between the electrode formed in the space and an electrode formed on the resonator can be made shorter.

In the surface emitting laser according to the aspect of the invention, in the stacking direction, a size of the second distortion applier may be larger than a size of the resonator.

In the surface emitting laser with this configuration, for example, compared to the case where the size of the second distortion applier is equal to or smaller than the size of the resonator, even larger distortion may be applied to the active layer.

An atomic oscillator according to an aspect of the invention includes the surface emitting laser according to the aspect of the invention.

In the atomic oscillator, the surface emitting laser that can output a laser beam in a stable polarization direction may be used as a light source.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, embodiments of the invention will be explained in detail using the drawings. The embodiments to be explained do not unduly limit the invention described in the appended claims. Further, not all of the configurations to be explained are necessarily essential component elements.

1. Surface Emitting Laser

Figure 1:
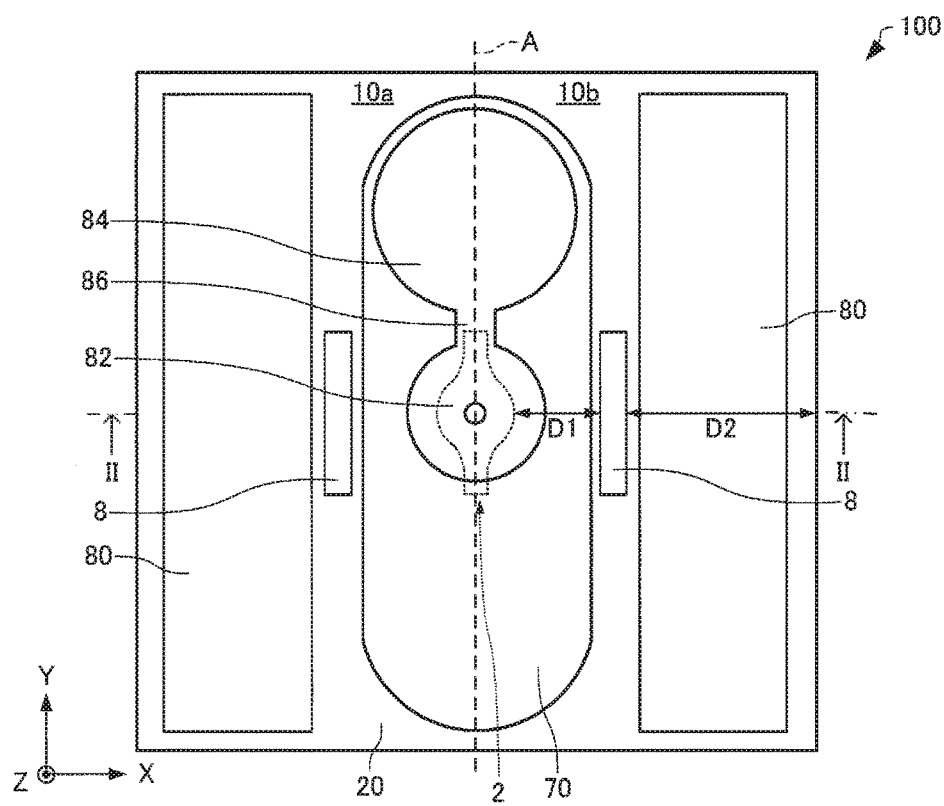
FIG. 1 is a plan view schematically showing a surface emitting laser according to an embodiment.
Figure 2:
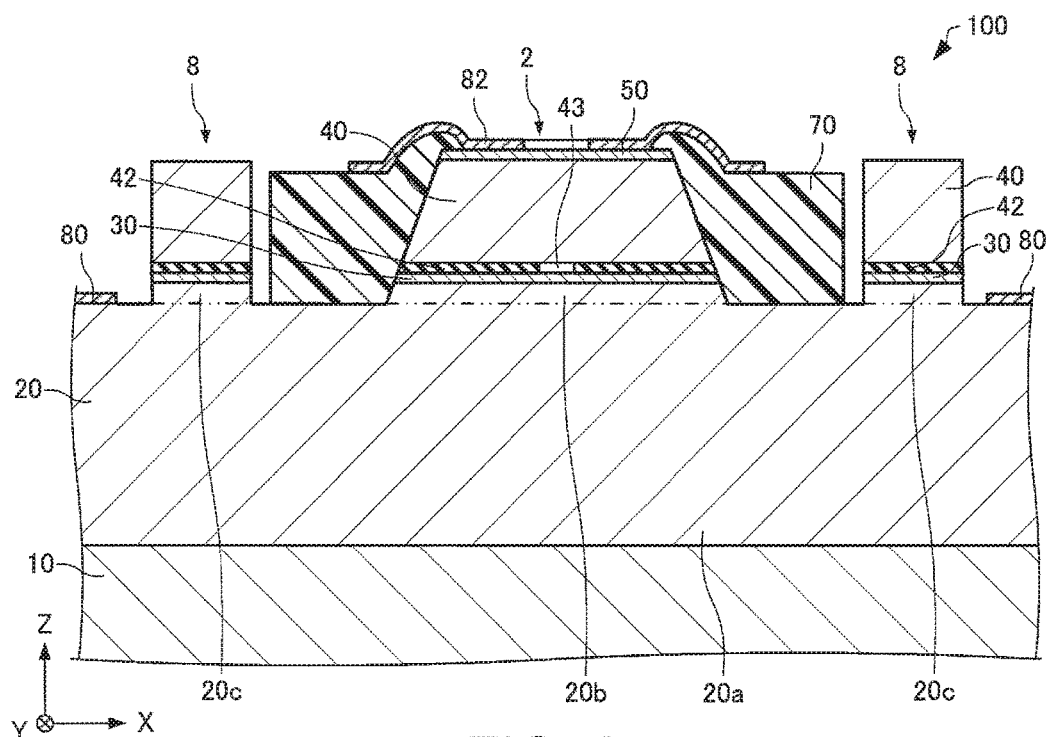
FIG. 2 is a sectional view schematically showing the surface emitting laser according to the embodiment.
Figure 3:
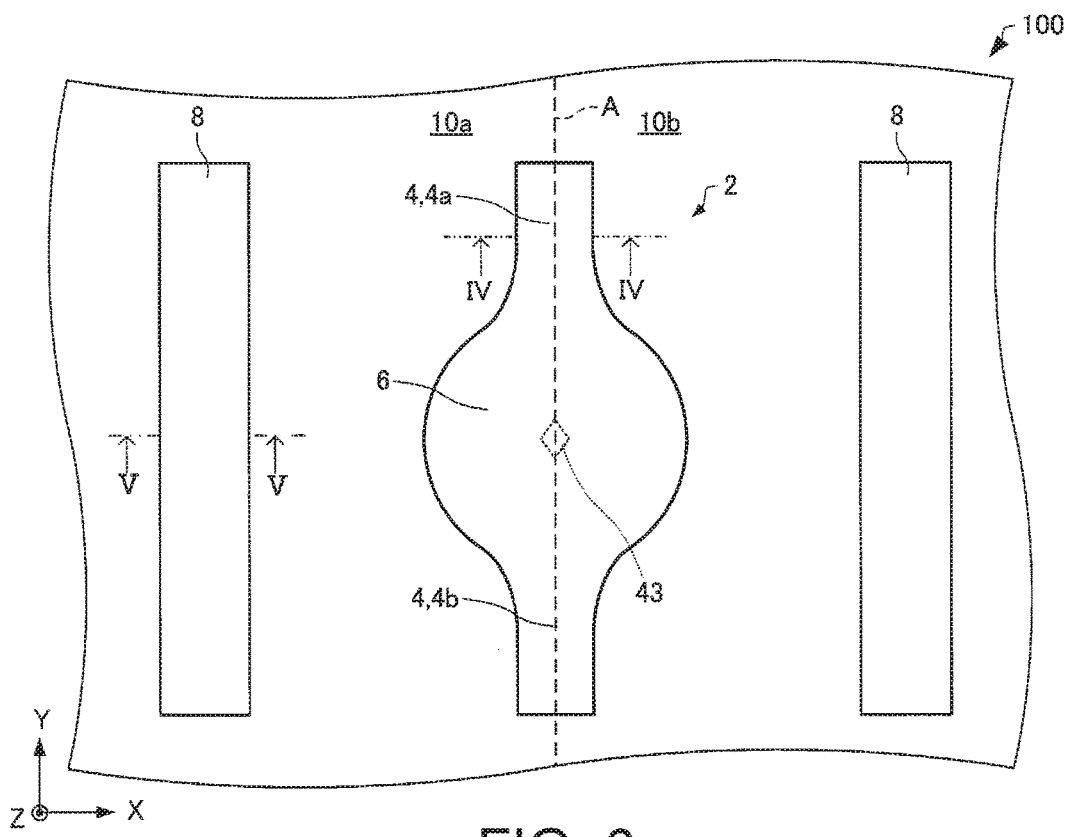
FIG. 3 is a plan view schematically showing the surface emitting laser according to the embodiment.
Figure 4:
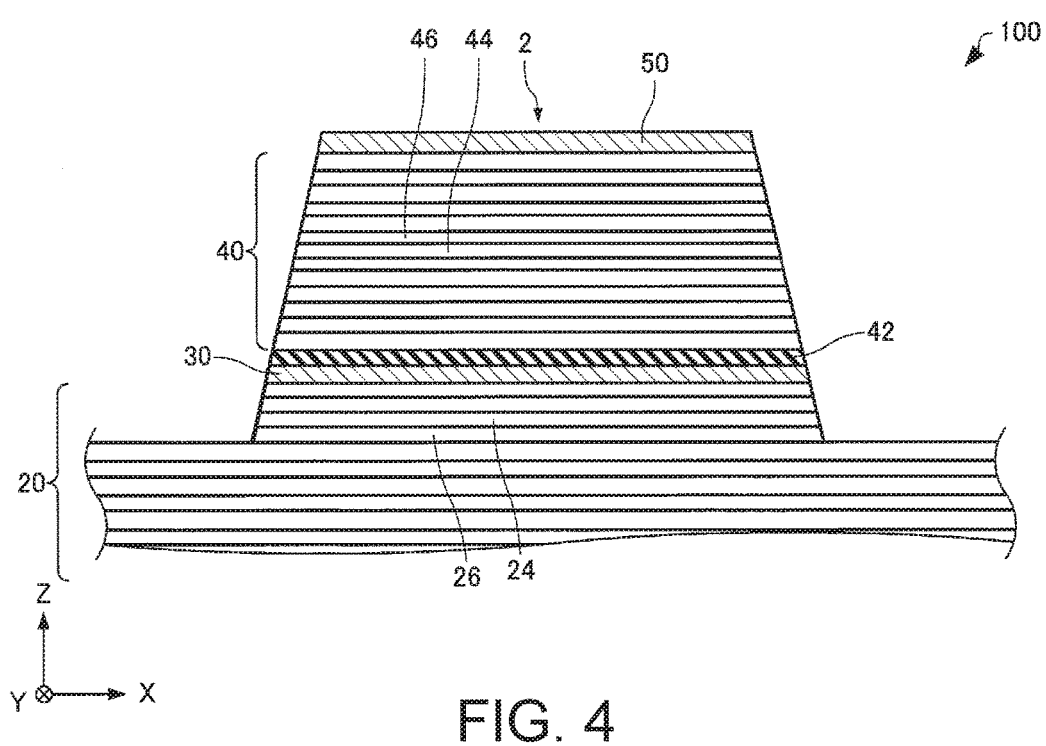
FIG. 4 is a sectional view schematically showing the surface emitting laser according to the embodiment.
Figure 5:
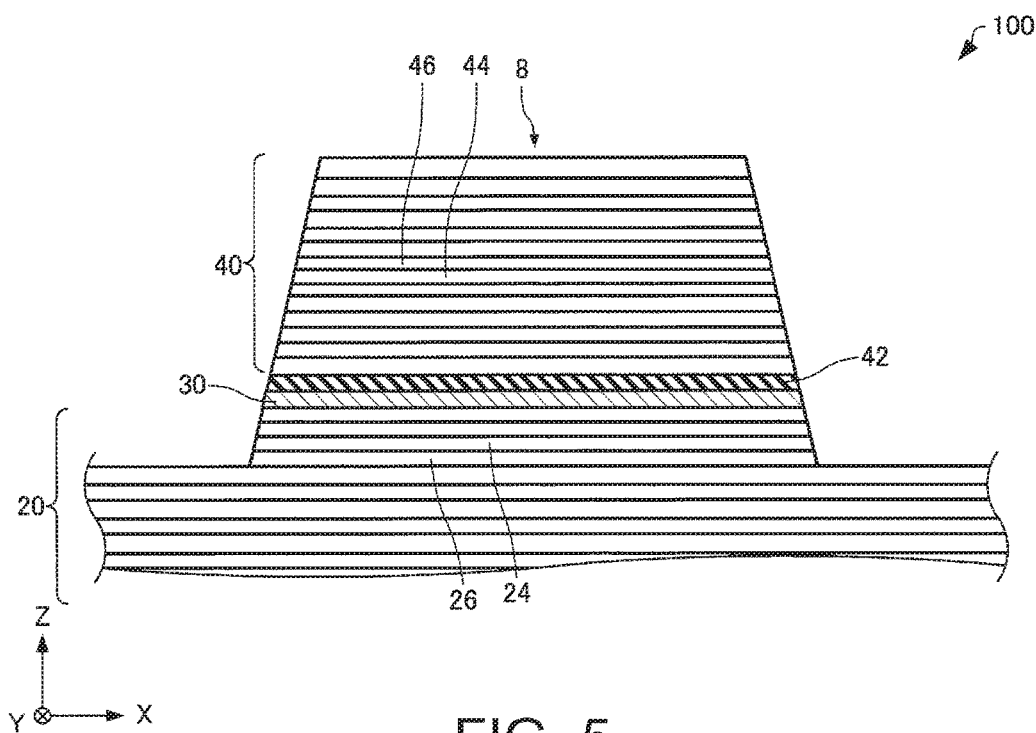
FIG. 5 is a sectional view schematically showing the surface emitting laser according to the embodiment.

First, a surface emitting laser according to an embodiment will be explained with reference to the drawings. FIG. 1 is a plan view schematically showing the surface emitting laser 100 according to the embodiment. FIG. 2 is a sectional view along line II-II in FIG. 1 schematically showing the surface emitting laser 100 according to the embodiment. FIG. 3 is a plan view schematically showing the surface emitting laser 100 according to the embodiment. FIG. 4 is a sectional view along line IV-IV in FIG. 3 schematically showing the surface emitting laser 100 according to the embodiment. FIG. 5 is a sectional view along line V-V in FIG. 3 schematically showing the surface emitting laser 100 according to the embodiment.

Note that, for convenience, in FIG. 2, a stacked structure 2 and a second distortion applier 8 are simplified. Further, in FIG. 3, the other members than the stacked structure 2 and the second distortion applier 8 of the surface emitting laser 100 are omitted. Further, in FIGS. 1 to 5, an X-axis, a Y-axis, and a Z-axis are shown as three axes orthogonal to one another.

As shown in FIGS. 1 to 5, the surface emitting laser 100 includes a substrate 10, a first mirror layer 20, an active layer 30, a second mirror layer 40, a current confinement layer 42, a contact layer 50, a resin layer (insulating layer) 70, a first electrode 80, and a second electrode 82.

For example, the substrate 10 is a first conductivity-type (e.g. n-type) GaAs substrate. On the substrate 10, the stacked structure 2 having a first distortion applier 4 and a resonator 6 and the second distortion applier 8 are provided.

The first mirror layer 20 is formed on the substrate 10. The first mirror layer 20 is a first conductivity-type semiconductor layer. As shown in FIGS. 4 and 5, the first mirror layer 20 is a distributed Bragg reflection (DBR) mirror in which a high-refractive-index layer 24 and a low-refractive-index layer 26 are alternately stacked. The high-refractive-index layer 24 is e.g. an n-type Al0.12Ga0.88As layer doped with silicon. The low-refractive-index layer 26 is e.g. an n-type Al0.9Ga0.1As layer doped with silicon. For example, the number of stacked layers (number of pairs) of the high-refractive-index layer 24 and the low-refractive-index layer 26 is from 10 pairs to 50 pairs, e.g. 40.5 pairs.

As shown in FIG. 2, the first mirror layer 20 has a first portion 20a provided on the substrate 10, a second portion 20b provided on the first portion 20a and forming a part of the stacked structure 2, and a third portion 20c provided on the first portion 20a and forming a part of the second distortion applier 8.

The active layer 30 is provided on the first mirror layer 20. The active layer 30 has a multiple quantum well (MQW) structure in which three layers of a quantum well structure including e.g. an i-type In0.06Ga0.94As layer and an i-type Al0.3Ga0.7As layer are stacked. The active layer 30 is sandwiched by the first mirror layer 20 and the second mirror layer 40.

The second mirror layer 40 is formed on the active layer 30. The second mirror layer 40 is a second conductivity-type (e.g. p-type) semiconductor layer. The second mirror layer 40 is a distributed Bragg reflection (DBR) mirror in which a high-refractive-index layer 44 and a low-refractive-index layer 46 are alternately stacked. The high-refractive-index layer 44 is e.g. a p-type Al0.12Ga0.88As layer doped with carbon. The low-refractive-index layer 46 is e.g. a p-type Al0.9Ga0.1As layer doped with carbon. For example, the number of stacked layers (number of pairs) of the high-refractive-index layer 44 and the low-refractive-index layer 46 is from 3 pairs to 40 pairs, e.g. 20 pairs in the stacked structure 2 shown in FIG. 4. Further, in the second distortion applier 8 shown in FIG. 5, the number of stacked layers (number of pairs) of the high-refractive-index layer 44 and the low-refractive-index layer 46 may be the same as the number of stacked layers in the stacked structure 2 shown in FIG. 4 or larger than the number of stacked layers in the stacked structure 2.

In the resonator 6, the second mirror layer 40, the active layer 30, and the first mirror layer 20 form a vertical resonator pin diode. When a forward voltage of the pin diode is applied between the electrodes 80, 82, electrons and holes are recombined in the active layer 30 and light is emitted. The light generated in the active layer 30 reciprocates between the first mirror layer 20 and the second mirror layer 40 (is multiply reflected), and stimulated emission occurs and the intensity is amplified. Then, when light gain exceeds light loss, laser oscillation occurs and a laser beam is output from the upper surface of the contact layer 50 in the vertical direction (in the stacking direction of the first mirror layer 20 and the active layer 30).

The current confinement layer 42 is provided between the first mirror layer 20 and the second mirror layer 40. In the illustrated example, the current confinement layer 42 is provided on the active layer 30. The current confinement layer 42 may be provided inside of the first mirror layer 20 or second mirror layer 40. The current confinement layer 42 is an insulating layer. In the resonator 6, an opening portion 43 is formed in the current confinement layer 42. The current confinement layer 42 may prevent spread of the current injected into the vertical resonator by the electrodes 80, 82 in a planar direction (a direction orthogonal to the stacking direction of the first mirror layer 20 and the active layer 30).

The contact layer 50 is provided on the second mirror layer 40 in the stacked structure 2. The contact layer 50 is a second conductivity-type semiconductor layer. Specifically, the contact layer 50 is a p-type GaAs layer doped with carbon. In the illustrated example, the contact layer 50 is not provided in the second distortion applier 8.

The stacked structure 2 is provided on the substrate 10. In the illustrated example, the stacked structure 2 is provided on the substrate 10 via the first mirror layer 20. The stacked structure 2 forms a convex part projecting in the Z-axis direction on the first portion 20a of the first mirror layer 20. The stacked structure 2 includes the first mirror layer 20 (second portion 20b), the active layer 30, the second mirror layer 40, the current confinement layer 42, and the contact layer 50.

The stacked structure 2 is surrounded by the resin layer 70. In the plan view (as seen from the stacking direction of the first mirror layer 20 and the active layer 30, as seen from the Z-axis direction in the illustrated example), the length of the stacked structure 2 in the Y-axis direction is longer than the length of the stacked structure 2 in the X-axis direction. That is, the longitudinal direction of the stacked structure 2 is the Y-axis direction. In the plan view, for example, the stacked structure 2 is symmetric with respect to a virtual line passing through the center of the stacked structure 2 in parallel to the X-axis direction. Further, in the plan view, for example, the stacked structure 2 is symmetric with respect to a virtual line passing through the center of the stacked structure 2 in parallel to the Y-axis direction.

As shown in FIG. 3, in the plan view, the stacked structure 2 includes the first distortion applier 4 and the resonator 6.

The first distortion applier 4 is connected to the resonator 6. The first distortion applier 4 has a first portion 4a and a second portion 4b. In the plan view, the first portion 4a and the second portion 4b are opposed in the Y-axis direction with the resonator 6 in between. In the plan view, the first portion 4a and the second portion 4b project from the resonator 6 in opposite directions to each other. Specifically, the first portion 4a projects from the resonator 6 in the +Y-axis direction in the plan view. The second portion 4b projects from the resonator 6 in the −Y-axis direction in the plan view. The first portion 4a and the second portion 4b are provided integrally with the resonator 6.

The length of the first distortion applier 4 in the Y-axis direction (the sum of the length of the first portion 4a in the Y-axis direction and the length of the second portion 4b in the Y-axis direction) is larger than the length of the first distortion applier 4 in the X-axis direction. That is, the planar shape of the first distortion applier 4 (the shape as seen from the stacking direction of the first mirror layer 20 and the active layer 30) is a shape having the longitudinal direction in the Y-axis direction. Note that the length of the first portion 4a (or second portion 4b) in the Y-axis direction refers to the length in the part in which the length in the Y-axis direction is largest in the first portion 4a. Further, the length of the first distortion applier 4 in the X-axis direction refers to the length in the part in which the length in the X-axis direction is largest in the first distortion applier 4.

The first distortion applier 4 applies anisotropic distortion to the active layer 30 and polarizes the light generated in the active layer 30. Here, to polarize light is to fix the vibration direction of the electric field of the light. The semiconductor layers (first mirror layer 20, active layer 30, second mirror layer 40, current confinement layer 42) forming the first distortion applier 4 serves as a generation source that generates distortion applied to the active layer 30.

Here, the reason that the first distortion applier 4 may apply anisotropic distortion to the active layer 30 forming the resonator 6 is explained.

Figure 6:
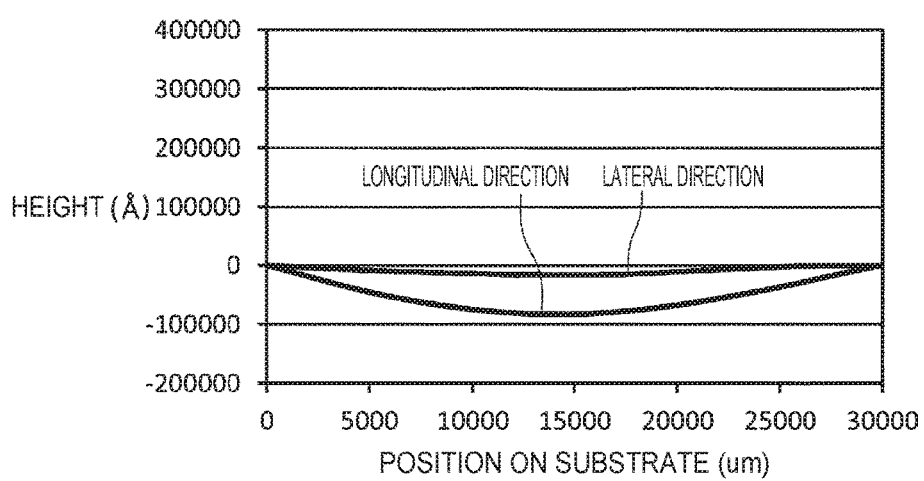
FIG. 6 is a graph showing results of measurements of warpage of a bare substrate.
Figure 7:
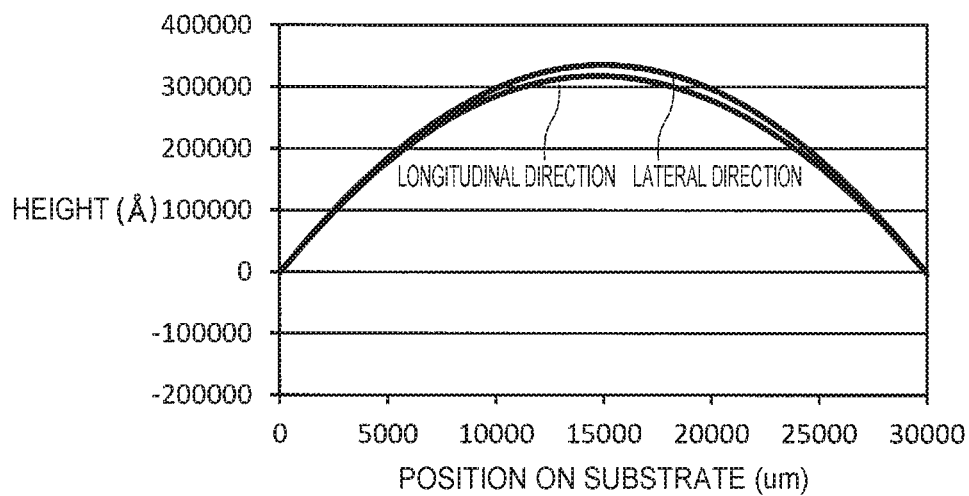
FIG. 7 is a graph showing results of measurements of warpage of an epi substrate.
Figure 8:
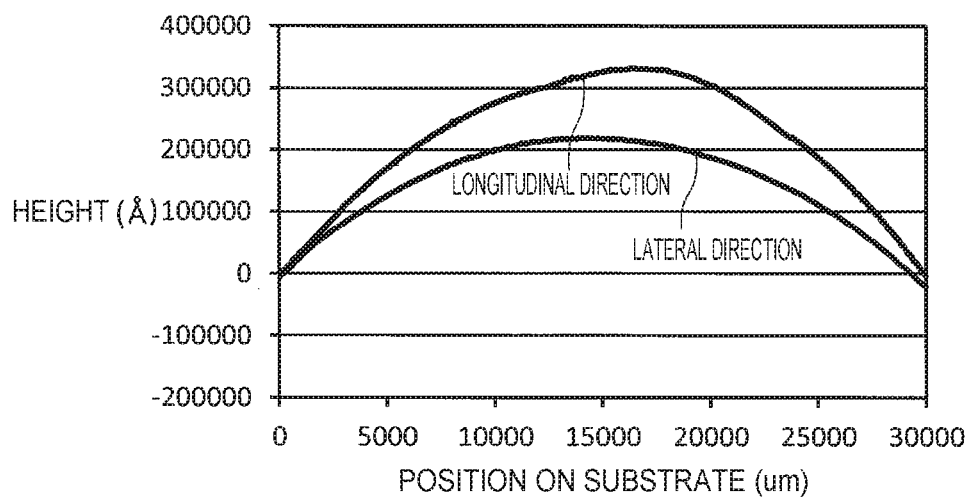
FIG. 8 is a graph showing results of measurements of warpage of a substrate after the surface emitting laser is completed.

FIG. 6 is a graph showing results of measurements of warpage of a bare substrate. FIG. 7 is a graph showing results of measurements of warpage of an epi substrate. FIG. 8 is a graph showing results of measurements of warpage of a substrate after the surface emitting laser including the first distortion applier is completed (completed substrate).

Note that the bare substrate is a substrate (wafer) on which no semiconductor layer is deposited. The epi substrate is a substrate (wafer) on which semiconductor layers (first mirror layer, active layer, second mirror layer, current confinement layer, and contact layer) forming the surface emitting laser are deposited on the bare substrate. In the epi substrate, the deposited semiconductor layers are not patterned. The completed substrate refers to a substrate (wafer) in which the semiconductor layers deposited on the epi substrate are patterned, electrodes, a resin layer, etc. are formed thereon, and the surface emitting laser is completed. The surface emitting laser formed in the completed substrate corresponds to the above described surface emitting laser 100 without the second distortion applier 8. Further, a plurality of surface emitting lasers are formed in the completed substrate.

FIGS. 6 to 8 show the results of measurements of warpage of the substrates in the respective directions by scanning of the substrates (wafers) in the lateral direction (corresponding to the X-axis direction shown in FIGS. 1 to 5) and the longitudinal direction (corresponding to the Y-axis direction shown in FIGS. 1 to 5, the same direction as the longitudinal direction of the first distortion applier) using a profilometer. Note that the thicknesses of the bare substrate and the epi substrate are 350 μm and the thickness of the completed substrate is 200 μm.

As shown in FIGS. 6 and 7, when semiconductor layers are deposited on the bare substrate, stress is generated due to a difference between the coefficient of linear expansion of (linear expansion coefficient) the bare substrate and the coefficient of linear expansion of the semiconductor layers, and the substrate is warped. Here, the coefficient of linear expansion of the substrate (GaAs substrate) is $5.97 \times 10^{-6}$/K. Further, the coefficient of linear expansion of the first mirror layer (nDBR layer including the n-type Al0.12Ga0.88As layer and the n-type Al0.9Ga0.1As) is $5.037 \times 10^{-6}$/K. Furthermore, the coefficient of linear expansion of the second mirror layer (pDBR layer including the p-type Al0.12Ga0.88As layer and the p-type Al0.9Ga0.1As) is $5.019 \times 10^{-6}$/K. Therefore, the coefficient of linear expansion of the first distortion applier is smaller than the coefficient of linear expansion of the substrate. As a result, as shown in FIG. 7, the epi substrate convexly warps so that the height of the center part of the substrate may be larger than the height of the end portion of the substrate.

The warpage of the substrate generated due to the deposition of the semiconductor layers on the bare substrate usually reduces by patterning of the semiconductor layers or the like for completion of the surface emitting laser. This is because the stress generated due to the coefficient of linear expansion of the bare substrate and the coefficient of linear expansion of the semiconductor layers is released by patterning of the semiconductor layers.

As shown in FIG. 8, in the completed substrate, compared to the epi substrate shown in FIG. 7, the warpage in the lateral direction is smaller, but the warpage in the longitudinal direction is nearly maintained. This is because the longitudinal direction of the first distortion applier is aligned with the longitudinal direction of the substrate (Y-axis direction), and thereby, the stress in the longitudinal direction is not released but maintained by the first distortion applier. As shown in FIG. 8, the warpage of the substrate in the lateral direction decreases and the warpage of the substrate in the longitudinal direction is maintained, and thereby, anisotropic distortion may be applied to the substrate (the active layer formed on the substrate).

The resonator 6 is provided between the first portion 4a and the second portion 4b. The length of the resonator 6 in the X-axis direction is larger than the length of the first distortion applier 4 (first portion 4a and second portion 4b) in the X-axis direction. The planar shape of the resonator 6 is e.g. a circular shape.

The resonator 6 resonates the light generated in the active layer 30. That is, in the resonator 6, a vertical resonator is formed.

The second distortion applier 8 is provided on the substrate 10. In the illustrated example, the second distortion applier 8 is provided on the substrate 10 via the first mirror layer 20. The second distortion applier 8 forms a convex part projecting in the Z-axis direction on the first portion 20a of the first mirror layer 20. The second distortion applier 8 includes the first mirror layer 20 (third portion 20c), the active layer 30, the second mirror layer 40, and the current confinement layer 42.

The planar shape of the second distortion applier 8 is a shape having the longitudinal direction in the Y-axis direction. That is, the length of the second distortion applier 8 in the Y-axis direction is longer than the length of the second distortion applier 8 in the X-axis direction. The planar shape of the second distortion applier 8 is e.g. a rectangular shape having a long side in the Y-axis direction. Note that the planar shape of the second distortion applier 8 is not particularly limited as long as the shape has the longitudinal direction. To increase the anisotropic distortion applied to the active layer 30 by the second distortion applier 8, it is desirable that, in plan view, the ratio between the length L1 in the lateral direction and the length L2 in the longitudinal direction of the second distortion applier 8 (L2/L1) is larger.

The longitudinal direction of the second distortion applier 8 and the longitudinal direction of the first distortion applier 4 are the same direction (Y-axis direction). That is, the longitudinal direction of the second distortion applier 8 and the longitudinal direction of the first distortion applier 4 are parallel. The length of the second distortion applier 8 in the longitudinal direction (Y-axis direction) is equal to e.g. the length of the stacked structure 2 in the longitudinal direction (Y-axis direction).

In the surface emitting laser 100, when the substrate 10 is the GaAs substrate, the first mirror layer 20 and the second mirror layer 40 are the DBR layers each including the Al0.12Ga0.88As layer and the Al0.9Ga0.1As layer, the coefficient of linear expansion of the first distortion applier 4 is smaller than the coefficient of linear expansion of the substrate 10 as described above. Further, the second distortion applier 8 has the same layer structure as the first distortion applier 4 except that the contact layer 50 is not provided. Therefore, the coefficient of linear expansion of the second distortion applier 8 is smaller than the coefficient of linear expansion of the substrate 10 like that of the first distortion applier 4. As described above, the magnitude relationship of the coefficient of linear expansion of the second distortion applier 8 to the coefficient of linear expansion of the substrate 10 is the same as the magnitude relationship of the coefficient of linear expansion of the first distortion applier 4 to the coefficient of linear expansion of the substrate 10.

Note that, here, the case where both of the coefficients of linear expansion of the first distortion applier 4 and the second distortion applier 8 are smaller than the coefficient of linear expansion of the substrate 10 is explained. However, both of the coefficients of linear expansion of the first distortion applier 4 and the second distortion applier 8 may be larger than the coefficient of linear expansion of the substrate 10. Even in this case, the magnitude relationship of the coefficient of linear expansion of the second distortion applier 8 to the coefficient of linear expansion of the substrate 10 is the same as the magnitude relationship of the coefficient of linear expansion of the first distortion applier 4 to the coefficient of linear expansion of the substrate 10.

As described above, in the surface emitting laser 100, in the plan view, the longitudinal direction of the first distortion applier 4 and the longitudinal direction of the second distortion applier 8 are the same direction and the magnitude relationship of the coefficient of linear expansion of the second distortion applier 8 to the coefficient of linear expansion of the substrate 10 is the same as the magnitude relationship of the coefficient of linear expansion of the first distortion applier 4 to the coefficient of linear expansion of the substrate 10. Thereby, the distortion applied to the active layer 30 by the second distortion applier 8 and the distortion applied to the active layer 30 by the first distortion applier 4 have the same anisotropy. That is, the second distortion applier 8 may apply the distortion having the same anisotropy as that of the first distortion applier 4 to the active layer 30.

The second distortion applier 8 is provided apart from the stacked structure 2. That is, the second distortion applier 8 and the stacked structure 2 are not in contact.

A plurality of the second distortion appliers 8 are provided. In the illustrated example, two of the second distortion appliers 8 are provided. Though not shown, only one of the second distortion applier 8 may be provided. In the plan view, when the substrate 10 is divided in a first region 10a and a second region 10b at a boundary of a virtual line A passing through the center of the resonator 6 and extending in the longitudinal direction of the first distortion applier 4, one of the two second distortion appliers 8 is located in the first region 10a and the other of the two second distortion appliers 8 is located in the second region 10b. In the plan view, the two second distortion appliers 8 are provided symmetrically with respect to the virtual line A.

In the plan view, in the direction (X-axis direction) orthogonal to the longitudinal direction (Y-axis direction) of the first distortion applier 4, a distance D1 between the second distortion applier 8 and the stacked structure 2 is smaller than a distance D2 between the second distortion applier 8 and the end portion (outer edge) of the substrate 10.

Accordingly, the electrode 80 maybe provided between the second distortion applier 8 and the end portion of the substrate 10. Note that the distance D1 is the shortest distance between the second distortion applier 8 and the stacked structure 2 in the X-axis direction. Further, the distance D2 is the shortest distance between the second distortion applier 8 and the end portion of the substrate 10 in the X-axis direction.

As described above, the second distortion applier 8 includes the first mirror layer 20, the active layer 30, the second mirror layer 40, and the current confinement layer 42. The second distortion applier 8 may include the contact layer 50, however, it is more preferable not to include the contact layer 50. The material of the contact layer 50 is GaAs the same as that of the substrate 10 (that is, the coefficients of linear expansion are the same between the contact layer 50 and the substrate 10) and, if the second distortion applier 8 includes the contact layer 50, the contact layer 50 serves to reduce the effect of the distortion by the second distortion applier 8. For example, the height (the size in the Z-axis direction) of the second distortion applier 8 is smaller than the height (the size in the Z-axis direction) of the stacked structure 2. Though not illustrated, the height of the second distortion applier 8 and the height of the stacked structure 2 may be the same. In this regard, in the second distortion applier 8, the thickness of the second mirror layer 40 may be larger by the amount of the contact layer 50.

The resin layer 70 is provided on at least the side surface of the stacked structure 2. In the example shown in FIG. 1, the resin layer 70 covers the first distortion applier 4. That is, the resin layer 70 is provided on the side surface of the first distortion applier 4 and the upper surface of the first distortion applier 4. The resin layer 70 may completely cover the first distortion applier 4 or may partially cover the first distortion applier 4. The material of the resin layer 70 is e.g. polyimide. Note that the material is not necessarily the resin as long as the material is an insulating material because it is only necessary that the configuration corresponding to the resin layer 70 has at least the insulation function.

In the example shown in FIG. 3, in the plan view, the length of the resin layer 70 in the Y-axis direction is larger than the length of the resin layer 70 in the X-axis direction. That is, the longitudinal direction of the resin layer 70 is the Y-axis direction. The longitudinal direction of the resin layer 70 and the longitudinal direction of the stacked structure 2 are the same direction.

The resin layer 70 does not cover the second distortion applier 8. When the resin layer 70 is polyimide, the coefficient of linear expansion of the resin layer 70 is larger than the coefficient of linear expansion of the substrate 10. Accordingly, if the resin layer 70 covers the second distortion applier 8, the resin layer 70 reduces the effect of the distortion by the second distortion applier 8.

The first electrode 80 is provided on the first mirror layer 20. The first electrode 80 is in ohmic contact with the first mirror layer 20. The first electrode 80 is electrically connected to the first mirror layer 20. As the first electrode 80, e.g. a structure formed by stacking of a Cr layer, an AuGe layer, an Ni layer, and an Au layer in the order from the first mirror 20 side is used. The first electrode 80 is one electrode for injecting current to the active layer 30.

The second electrode 82 is provided on the contact layer 50 (on the stacked structure 2). The second electrode 82 is in ohmic contact with the contact layer 50. In the illustrated example, the second electrode 82 is further formed on the resin layer 70. The second electrode 82 is electrically connected to the second mirror layer 40 via the contact layer

50. As the second electrode 82, e.g. a structure formed by stacking of a Cr layer, a Pt layer, a Ti layer, a Pt layer, and an Au layer in the order from the contact layer 50 side is used. The second electrode 82 is the other electrode for injecting current to the active layer 30.

The second electrode 82 is electrically connected to a pad 84. In the illustrated example, the second electrode 82 is electrically connected to the pad 84 via a lead wire 86. The pad 84 is provided on the resin layer 70. The materials of the pad 84 and the lead wire 86 are the same as e.g. the material of the second electrode 82.

The surface emitting laser 100 has e.g. the following features.

In the surface emitting laser 100, the longitudinal direction of the second distortion applier 8 and the longitudinal direction of the first distortion applier 4 are the same direction and the magnitude relationship of the coefficient of linear expansion of the second distortion applier 8 to the coefficient of linear expansion of the substrate 10 is the same as the magnitude relationship of the coefficient of linear expansion of the first distortion applier 4 to the coefficient of linear expansion of the substrate 10. Accordingly, the second distortion applier 8 may apply the distortion having the same anisotropy as that of the first distortion applier 4 to the active layer 30. Therefore, in the surface emitting laser 100, for example, compared to a surface emitting laser not having the second distortion applier 8, but having only the first distortion applier 4 (a surface emitting laser of related art), stability of the polarization direction of the laser beam may be improved.

For example, when the surface emitting laser of related art is operated at a high temperature, the stress generated due to the difference between the coefficient of linear expansion of the substrate and the coefficient of linear expansion of the semiconductor layers decreases. Thereby, the difference between the distortion in the X-axis direction and the distortion in the Y-axis direction applied to the active layer becomes smaller and the stability of the polarization direction of the laser beam becomes lower. On the other hand, in the surface emitting laser 100, anisotropic distortion may be applied to the active layer 30 by the second distortion applier 8 in addition to the first distortion applier 4, and thereby, even when the laser is operated at the high temperature, the stability of the polarization direction of the laser beam is higher than the surface emitting laser of related art.

In the surface emitting laser 100, the second distortion applier 8 is apart from the stacked structure 2, and distortion may be applied to the active layer 30 without any change in the shape of the stacked structure 2.

In the surface emitting laser 100, the plurality of second distortion appliers 8 are provided. Accordingly, for example, compared to the case where only one second distortion applier 8 is provided, the larger distortion may be applied to the active layer 30 forming the resonator 6, and the stability of the polarization direction of the laser beam may be made higher.

In the surface emitting laser 100, when the substrate 10 is divided in the first region 10*a* and the second region 10*b*, one of the two second distortion appliers 8 is located in the first region 10*a* and the other of the two second distortion appliers 8 is located in the second region 10*b*. Accordingly, in the surface emitting laser 100, for example, compared to the case where the second distortion appliers 8 are located only in one region, distortion with better symmetry may be applied to the active layer 30 forming the resonator 6.

Here, an example of the method of measuring the coefficient of linear expansion is explained.

The magnitude relationship of the coefficient of linear expansion of the distortion applier (first distortion applier 4 or second distortion applier 8) to the coefficient of linear expansion of the substrate 10 can be measured by the following method.

First, a stacked structure having the same layer structure as the distortion applier to be measured is formed on the entire surface of the substrate. Thereby, warpage is produced due to the difference between the coefficient of linear expansion of the substrate and the coefficient of linear expansion of the stacked structure. When the amount of warpage of the substrate before the stacked structure is deposited is a radius of curvature R0 and the amount of warpage of the substrate after the stacked structure is deposited is a radius of curvature Rh, the stress by the stacked structure is proportional to (1/Rh−1/R0).

If (1/Rh−1/R0) is positive, the coefficient of linear expansion of the stacked structure is smaller than the coefficient of linear expansion of the substrate. Further, if (1/Rh−1/R0) is negative, the coefficient of linear expansion of the stacked structure is larger than the coefficient of linear expansion of the substrate.

Note that the magnitude relationship between the coefficients of linear expansion of the stacked structures having different layer structures is determined by the absolute value of (1/Rh−1/R0). The stacked structure having the larger absolute value of (1/Rh−1/R0) has the larger difference in coefficient of linear expansion from the substrate.

2. Method of Manufacturing Surface Emitting Laser

Figure 9:
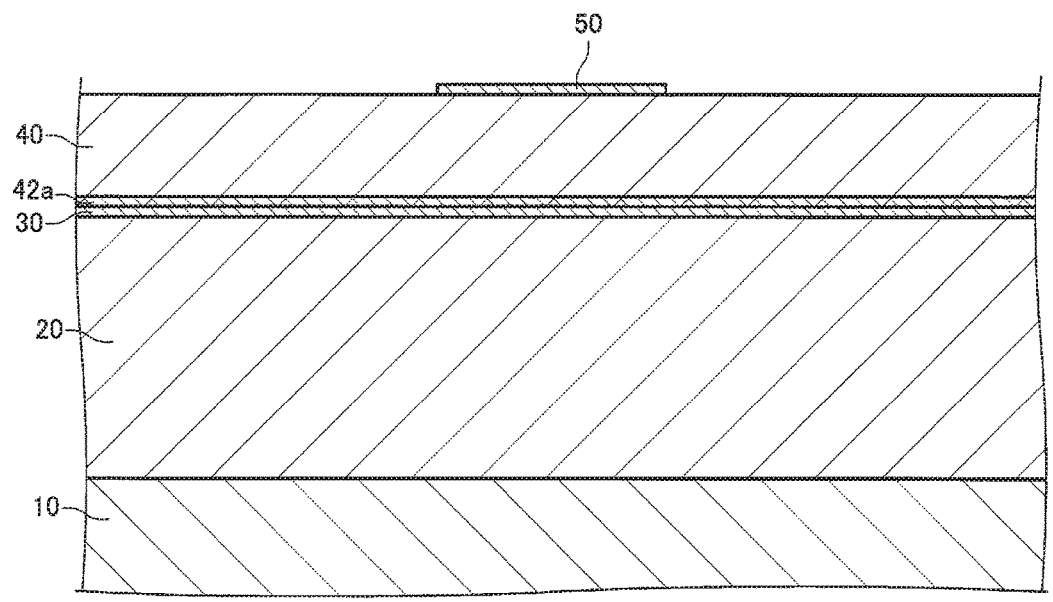
FIG. 9 is a sectional view schematically showing a manufacturing step of the surface emitting laser according to the embodiment.
Figure 10:
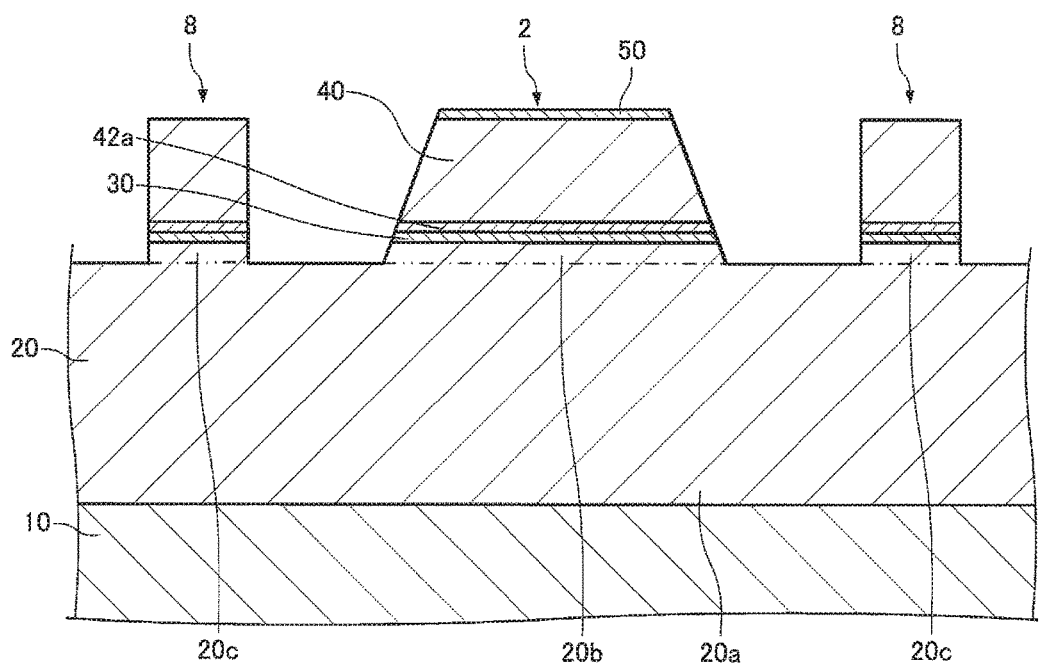
FIG. 10 is a sectional view schematically showing a manufacturing step of the surface emitting laser according to the embodiment.
Figure 11:
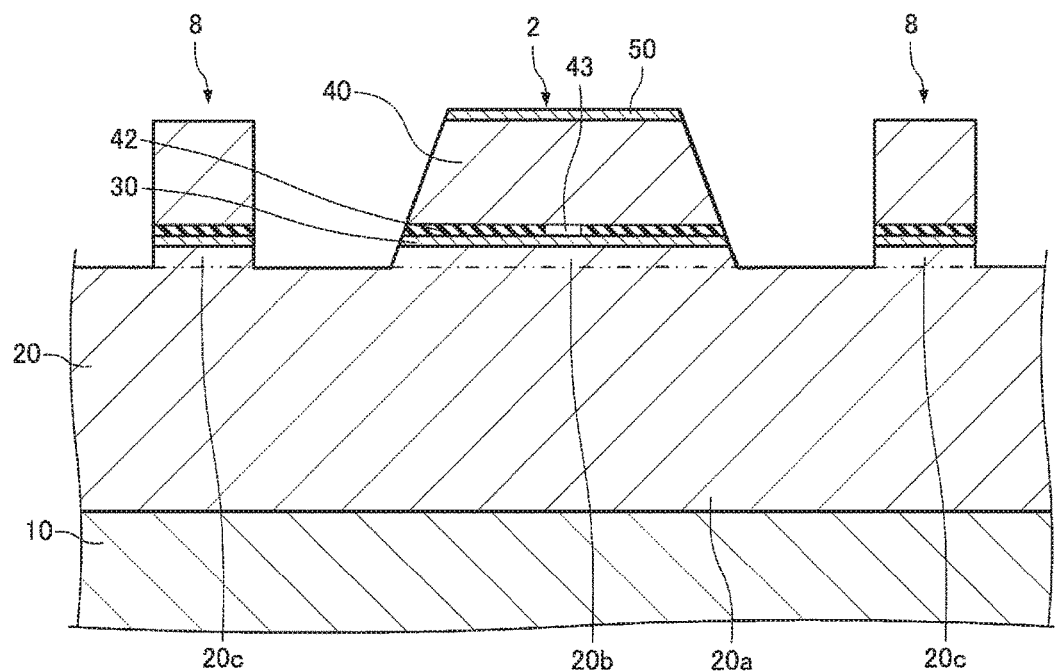
FIG. 11 is a sectional view schematically showing a manufacturing step of the surface emitting laser according to the embodiment.

Next, the method of manufacturing the surface emitting laser according to the embodiment will be explained with reference to the drawings. FIGS. 9 to 11 are sectional views schematically showing the manufacturing steps of the surface emitting laser 100 according to the embodiment, and correspond to FIG. 2.

As shown in FIG. 9, on the substrate 10, the first mirror layer 20, the active layer 30, a layer to be oxidized 42*a* as the current confinement layer 42, the second mirror layer 40, and the contact layer 50 are epitaxially grown in the order. As the epitaxial growth method includes e.g. MOCVD (Metal Organic Chemical Vapor Deposition) and MBE (Molecular Beam Epitaxy). Then, the contact layer 50 on the second distortion applier 8 is etched.

As shown in FIG. 10, the stacked structure 2 and the second distortion applier 8 are formed by patterning of the contact layer 50, the second mirror layer 40, the layer to be oxidized 42*a*, the active layer 30, and the first mirror layer 20. The patterning is performed by e.g. photolithography and etching. The contact layer 50 formed at the step shown in FIG. 9 forms the stacked structure 2.

As shown in FIG. 11, the current confinement layer 42 is formed by oxidation of the layer to be oxidized 42*a*. The layer to be oxidized 42*a* is e.g. an $Al_xGa_{1-x}As$ ($x \geq 0.95$) layer. For example, the substrate 10 with the stacked structure 2 formed thereon is put into a steam atmosphere at about 400° C., and thereby, the current confinement layer 42 is formed by oxidation of the $Al_xGa_{1-x}As$ ($x \geq 0.95$) layer from the side surface.

As shown in FIG. 2, the resin layer 70 is formed to surround the stacked structure 2. The resin layer 70 is formed by formation of a layer including polyimide resin or the like on the upper surface of the first mirror layer 20 and the entire surface of the stacked structure 2 using spin coating or the like and patterning of the layer. The patterning is performed by e.g. photolithography and etching. Then, the resin layer 70 is hardened by heating treatment (curing).

Then, the second electrode 82 is formed on the contact layer 50 and the resin layer 70, and the first electrode 80 is formed on the first mirror layer 20. The electrodes 80, 82 are formed by e.g. a combination of vacuum deposition and liftoff or the like. Note that the order of the formation of the electrodes 80, 82 is not particularly limited. Further, the pad 84 and the lead wire 86 (see FIG. 1) may be formed at the step of forming the second electrode 82.

The surface emitting laser 100 may be manufactured at the above described steps.

3. Modified Examples of Surface Emitting Laser

Next, modified examples of the surface emitting laser according to the embodiment will be explained with reference to the drawings. As below, in the surface emitting lasers according to the modified examples of the embodiment, differences from those of the above described example of the surface emitting laser 100 will be explained, and the explanation of the same parts will be omitted.

3.1. First Modified Example

Figure 12:
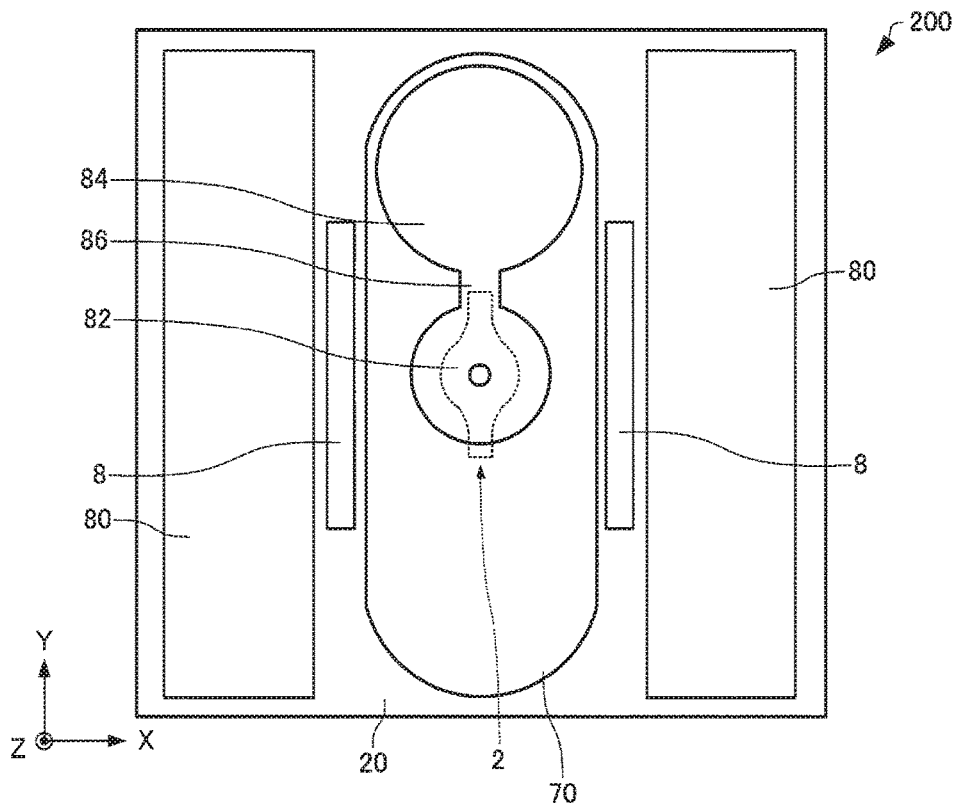
FIG. 12 is a plan view schematically showing a surface emitting laser according to a first modified example.

FIG. 12 is a plan view schematically showing a surface emitting laser 200 according to a first modified example.

In the above described surface emitting laser 100, as shown in FIG. 1, the length of the second distortion applier 8 in the longitudinal direction (Y-axis direction) is equal to the length of the stacked structure 2 in the longitudinal direction (Y-axis direction).

On the other hand, in the surface emitting laser 200 according to the first modified example, as shown in FIG. 12, the length of the second distortion applier 8 in the longitudinal direction is larger than the length of the stacked structure 2 in the longitudinal direction. The length of the second distortion applier 8 in the longitudinal direction is made larger, and thereby, larger distortion may be applied to the active layer 30 forming the resonator 6 and stability of the polarization direction of the laser beam may be further improved.

3.2. Second Modified Example

Figure 13:
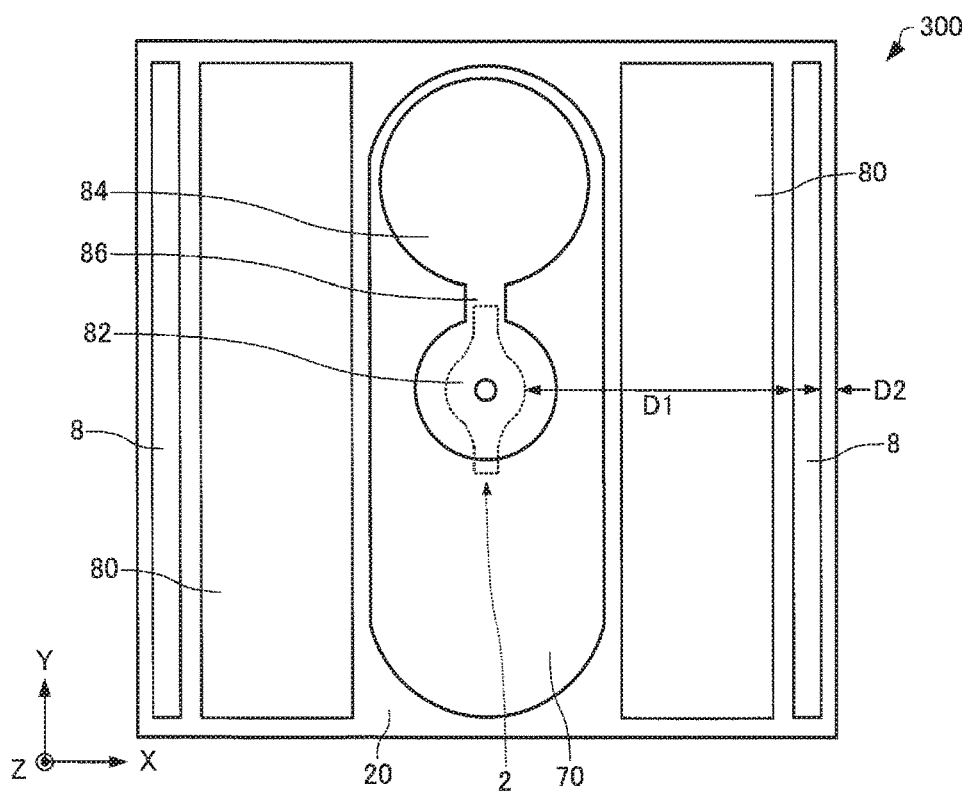
FIG. 13 is a plan view schematically showing a surface emitting laser according to a second modified example.

FIG. 13 is a plan view schematically showing a surface emitting laser 300 according to a second modified example.

In the above described surface emitting laser, as shown in FIG. 1, in the plan view, in the direction (X-axis direction) orthogonal to the longitudinal direction (Y-axis direction) of the first distortion applier 4, the distance D1 between the second distortion applier 8 and the stacked structure 2 is smaller than the distance D2 between the second distortion applier 8 and the end portion of the substrate 10.

On the other hand, in the surface emitting laser 300 according to the second modified example, as shown in FIG. 13, in the plan view, in the direction (X-axis direction) orthogonal to the longitudinal direction (Y-axis direction) of the first distortion applier 4, the distance D1 between the second distortion applier 8 and the stacked structure 2 is larger than the distance D2 between the second distortion applier 8 and the end portion of the substrate 10. Thereby, a space may be formed between the stacked structure 2 and the second distortion applier 8, and the first electrode 80 may be provided in the space. As a result, for example, compared to the case where the first electrode 80 is provided between the second distortion applier 8 and the end portion of the substrate 10 (see FIG. 1), the first electrode 80 maybe placed closer to the stacked structure 2 and the current path between the first electrode 80 and the second electrode 82 may be made shorter.

In the example shown in FIG. 13, the second distortion applier 8 extends from the end portion in the +Y-axis direction to the end portion in the −Y-axis direction of the substrate 10. As described above, the length of the second distortion applier 8 in the longitudinal direction is made larger, and thereby, the distortion applied to the active layer 30 by the second distortion applier 8 may be made larger and the stability of the polarization direction of the laser beam may be further improved.

3.3. Third Modified Example

Figure 14:
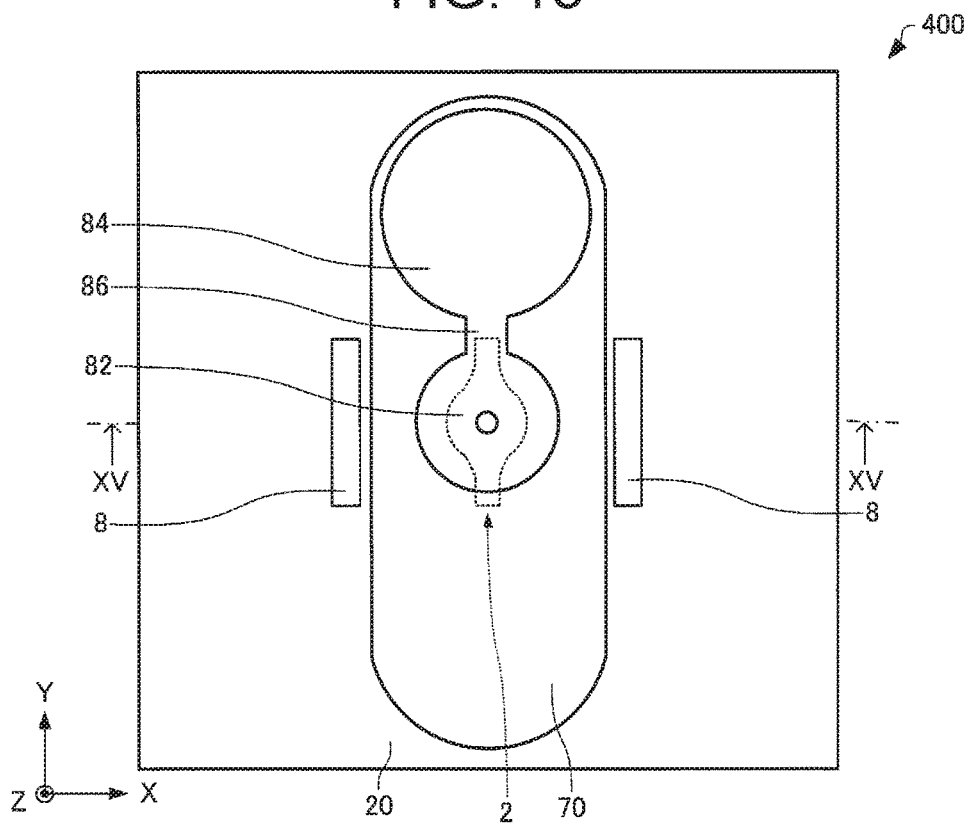
FIG. 14 is a plan view schematically showing a surface emitting laser according to a third modified example.
Figure 15:
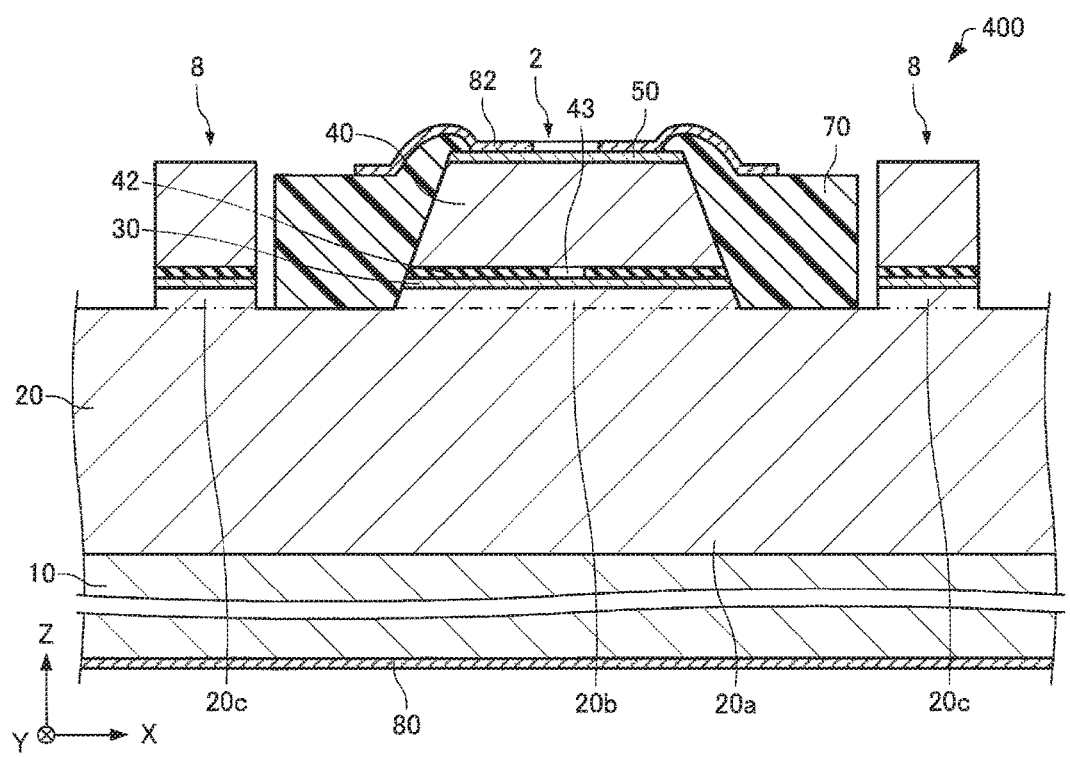
FIG. 15 is a sectional view schematically showing the surface emitting laser according to the third modified example.

FIG. 14 is a plan view schematically showing a surface emitting laser 400 according to a third modified example. FIG. 15 is a sectional view along line XV-XV in FIG. 14 schematically showing the surface emitting laser 400 according to the third modified example.

In the above described surface emitting laser 100, as shown in FIGS. 1 and 2, the first electrode 80 is provided on the first mirror layer 20.

On the other hand, in the surface emitting laser 400 according to the third modified example, as shown in FIGS. 14 and 15, the first electrode 80 is provided on the lower surface of the substrate 10 (the opposite surface to the surface on which the stacked structure 2 is formed). For example, the first electrode 80 is provided on the entire of the lower surface of the substrate 10.

The first electrode 80 is provided on the lower surface of the substrate 10, and thereby, for example, compared to the case where the first electrode 80 is formed on the first mirror layer 20, the degree of freedom of placement of the second distortion applier 8 may be made higher.

3.4. Fourth Modified Example

Figure 16:
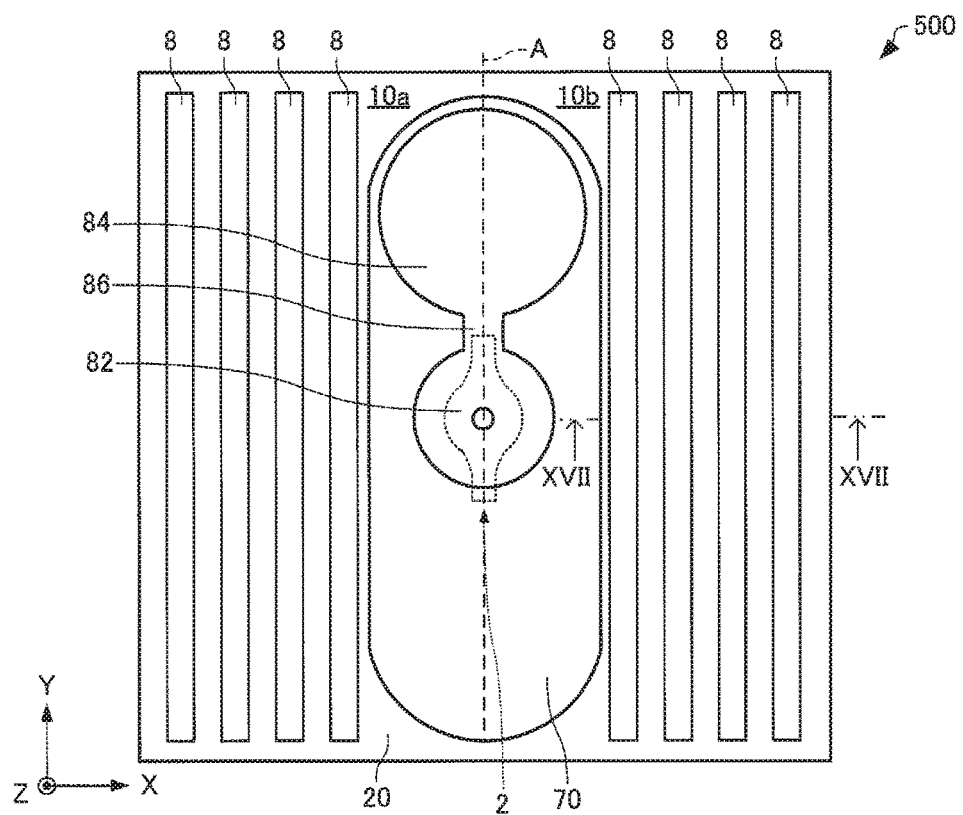
FIG. 16 is a plan view schematically showing a surface emitting laser according to a fourth modified example.
Figure 17:
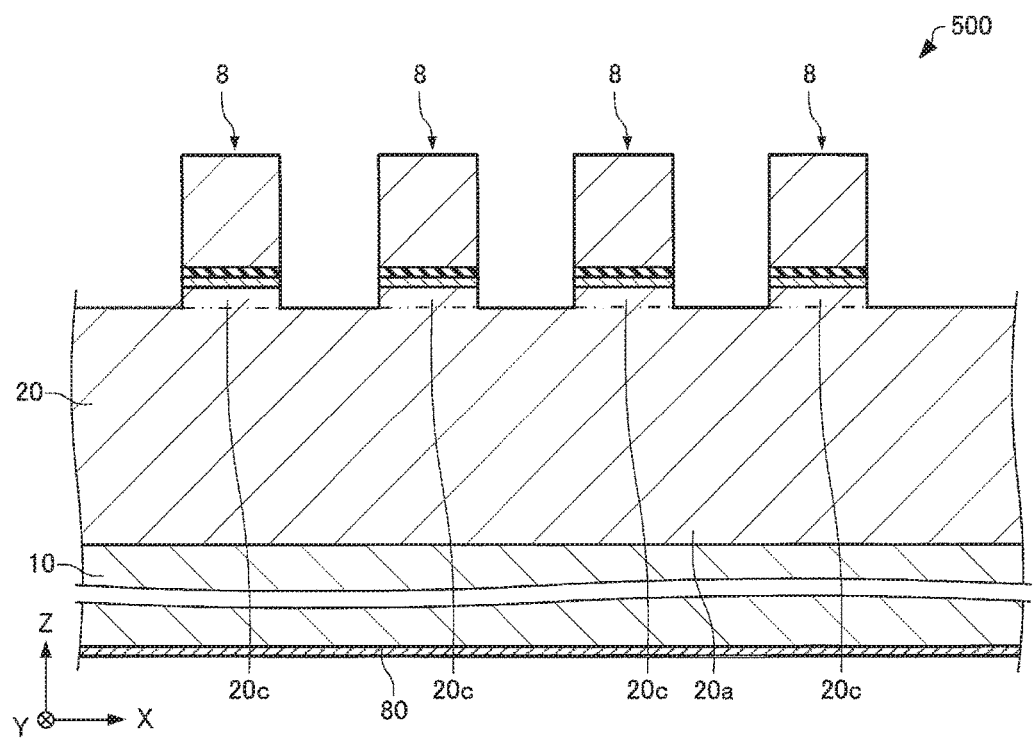
FIG. 17 is a sectional view schematically showing the surface emitting laser according to the fourth modified example.

FIG. 16 is a plan view schematically showing a surface emitting laser 500 according to a fourth modified example. FIG. 17 is a sectional view along line XVII-XVII in FIG. 16 schematically showing the surface emitting laser 500 according to the fourth modified example.

As shown in FIG. 1, the above described surface emitting laser 100 has the two second distortion appliers 8, and, in the plan view, one of the two second distortion appliers 8 is located in the first region 10a and the other is located in the second region 10b.

On the other hand, as shown in FIGS. 16 and 17, the surface emitting laser 500 has a plurality of (eight) second distortion appliers 8 and, in the plan view, part (four) of the plurality of second distortion appliers 8 are located in the first region 10a and the other part (four) of second distortion appliers 8 are located in the second region 10b.

The number of second distortion appliers 8 located in the first region 10a and the number of second distortion appliers 8 located in the second region 10b are equal. Thereby, for example, compared to the case where the number of second distortion appliers 8 located in the first region 10a and the number of second distortion appliers 8 located in the second region 10b are different, distortion with better symmetry may be applied to the active layer 30 forming the resonator 6.

The plurality of second distortion appliers 8 are arranged in the direction (X-axis direction) orthogonal to the longitudinal direction (Y-axis direction) of the second distortion appliers 8. Accordingly, for example, compared to the case where the plurality of second distortion appliers 8 are arranged in the Y-axis direction, the size of the substrate 10 in the Y-axis direction may be made smaller. For example, in the case where the plurality of second distortion appliers 8 are arranged in the Y-axis direction, the longitudinal direction of the second distortion appliers 8 and the arrangement direction of the second distortion appliers 8 are the same direction, and the size of the substrate 10 in the Y-axis direction is larger.

The plurality of second distortion appliers 8 are arranged from the end portion in the −X-axis direction to the end portion in the +X-axis direction of the substrate 10 except the area in which the stacked structure 2 (resin layer 70) is formed. In the respective first region 10a and second region 10b, the second distortion appliers 8 are provided at equal intervals. The distance between the adjacent second distortion appliers 8 can be appropriately set. The plurality of second distortion appliers 8 are provided symmetrically with respect to the virtual line A.

The second distortion applier 8 extends from the end portion in the +Y-axis direction to the end portion in the −Y-axis direction of the substrate 10. The plurality of (eight) second distortion appliers 8 provided in the first region 10a and the second region 10b have the same shape.

In the surface emitting laser 500, the first electrode 80 is provided on the lower surface of the substrate 10, and thereby, for example, compared to the case where the first electrode 80 is provided on the first mirror layer 20, more second distortion appliers 8 may be provided on the first mirror layer 20.

Note that, in the surface emitting laser 500, the number of second distortion appliers 8 is not particularly limited. Further, as shown in FIG. 16, the lengths of the second distortion appliers 8 in the longitudinal direction are larger than the length of the stacked structure 2 in the longitudinal direction. Note that, though not shown, the lengths of the second distortion appliers 8 in the longitudinal direction may be made smaller than the length of the stacked structure 2 in the longitudinal direction.

3.5. Fifth Modified Example

Figure 18:
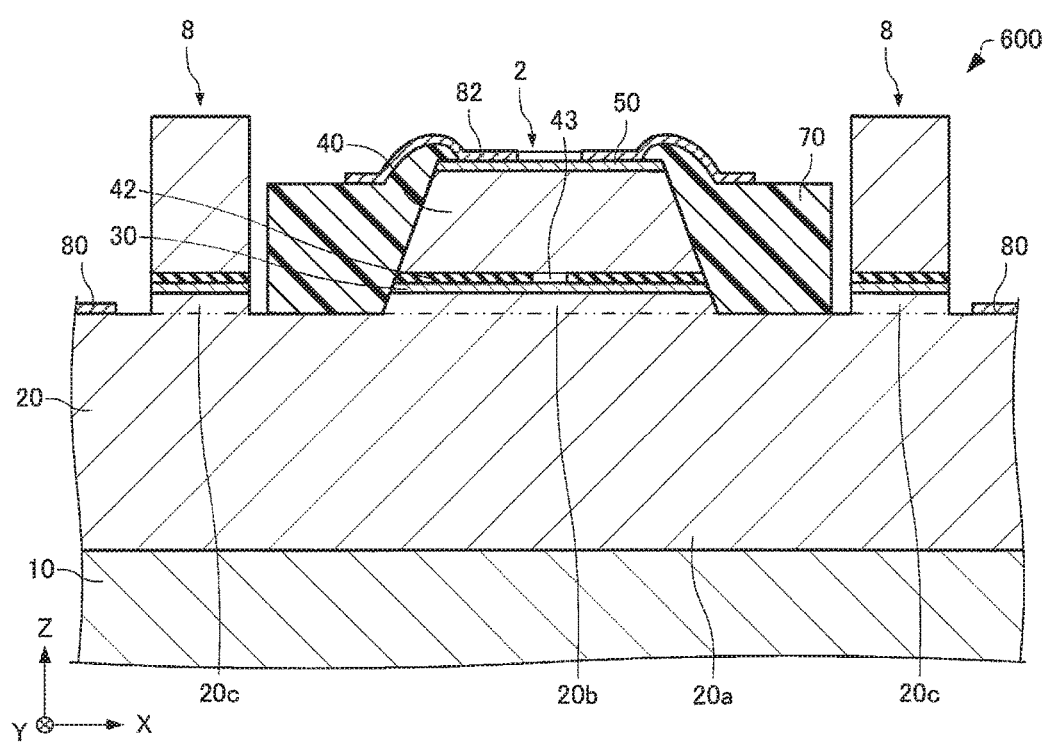
FIG. 18 is a sectional view schematically showing a surface emitting laser according to a fifth modified example.

FIG. 18 is a sectional view schematically showing a surface emitting laser 600 according to a fifth modified example.

In the above described surface emitting laser 100, as shown in FIG. 2, the height of the second distortion applier 8 (the size in the Z-axis direction, the size in the stacking direction of the first mirror layer 20 and the active layer 30) is smaller than the height of the stacked structure 2.

On the other hand, in the surface emitting laser 600 according to the fifth modified example, a shown in FIG. 18, the height of the second distortion applier 8 is larger than the height of the resonator 6 (stacked structure 2). Thereby, for example, compared to the case where the height of the second distortion applier 8 is smaller than the height of the resonator 6, larger distortion may be applied to the active layer 30 forming the resonator 6.

In the example shown in FIG. 18, the thickness of the second mirror layer 40 forming the second distortion applier 8 is made larger than the thickness of the second mirror layer 40 forming the stacked structure 2 (for example, the number of pairs of the high-refractive-index layer 24 and the low-refractive-index layer 26 is made larger), and thereby, the height of the second distortion applier 8 is made larger than the height of the resonator 6.

Figure 19:
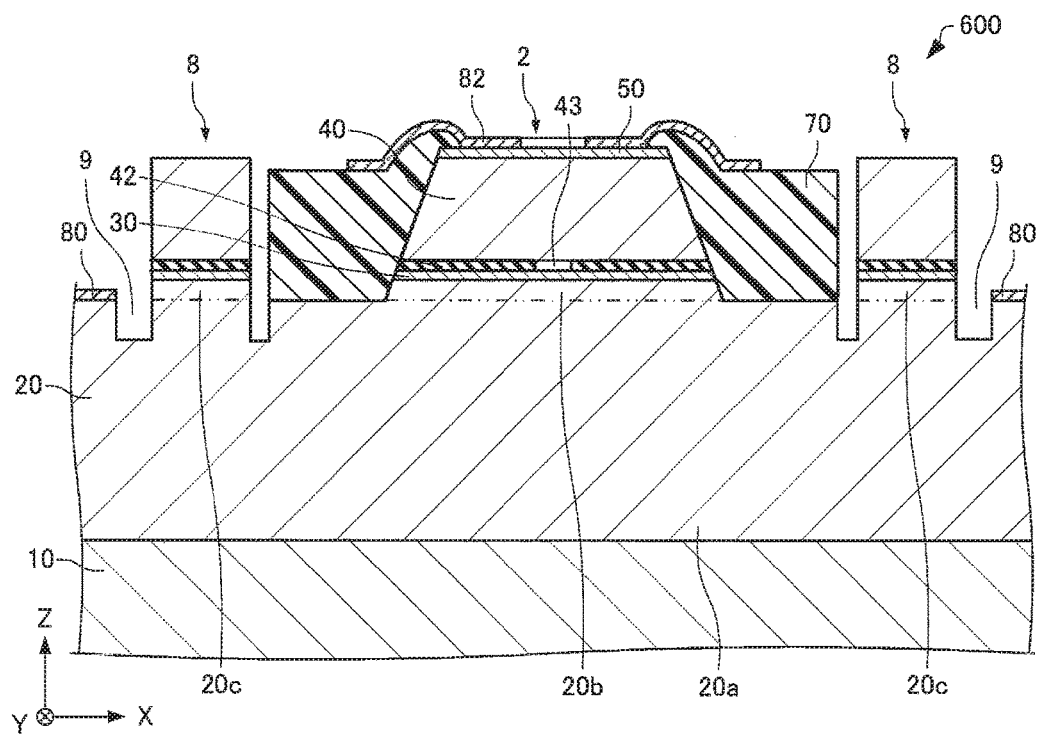
FIG. 19 is a sectional view schematically showing the surface emitting laser according to the fifth modified example.

Further, for example, as shown in FIG. 19, a groove 9 is formed around the second distortion applier 8, and thereby, the height of the second distortion applier 8 may be made larger than the height of the stacked structure 2.

Note that, here, the example in which the height of the first distortion applier 4 and the height of the resonator 6 are the same and the height of the second distortion applier 8 is made larger than the height of the first distortion applier 4 and the height of the resonator 6 is explained, however, the height of the second distortion applier 8 may be made larger than the height of the resonator 6 and the height of the second distortion applier 8 and the height of the first distortion applier 4 may be made equal.

3.6. Sixth Modified Example

Figure 20:
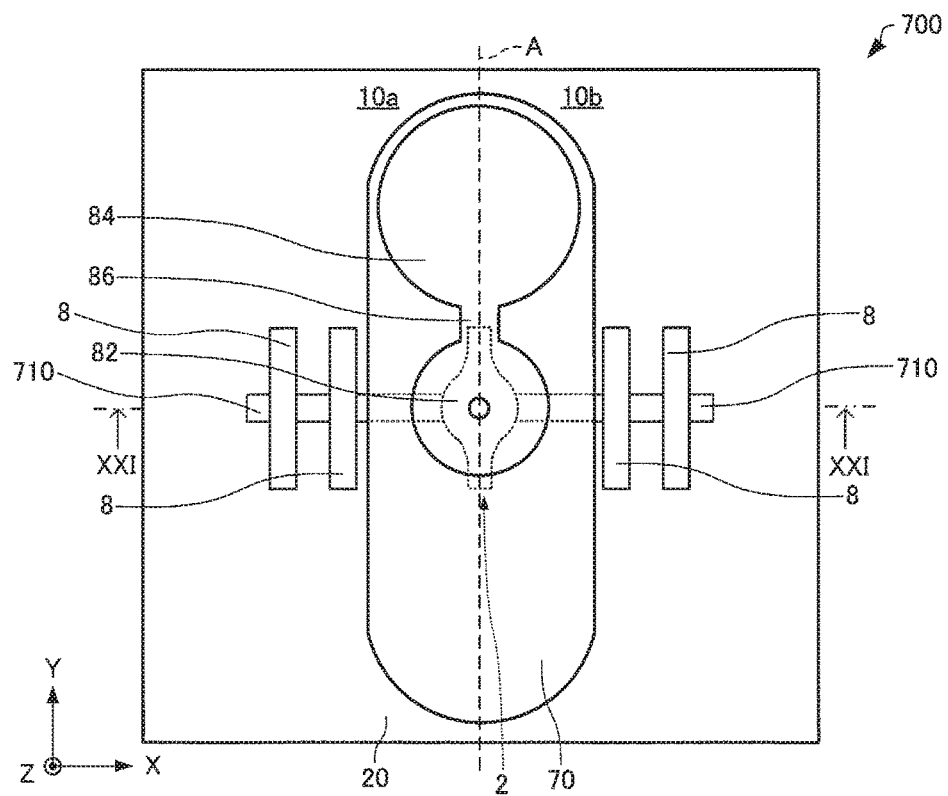
FIG. 20 is a plan view schematically showing a surface emitting laser according to a sixth modified example.
Figure 21:
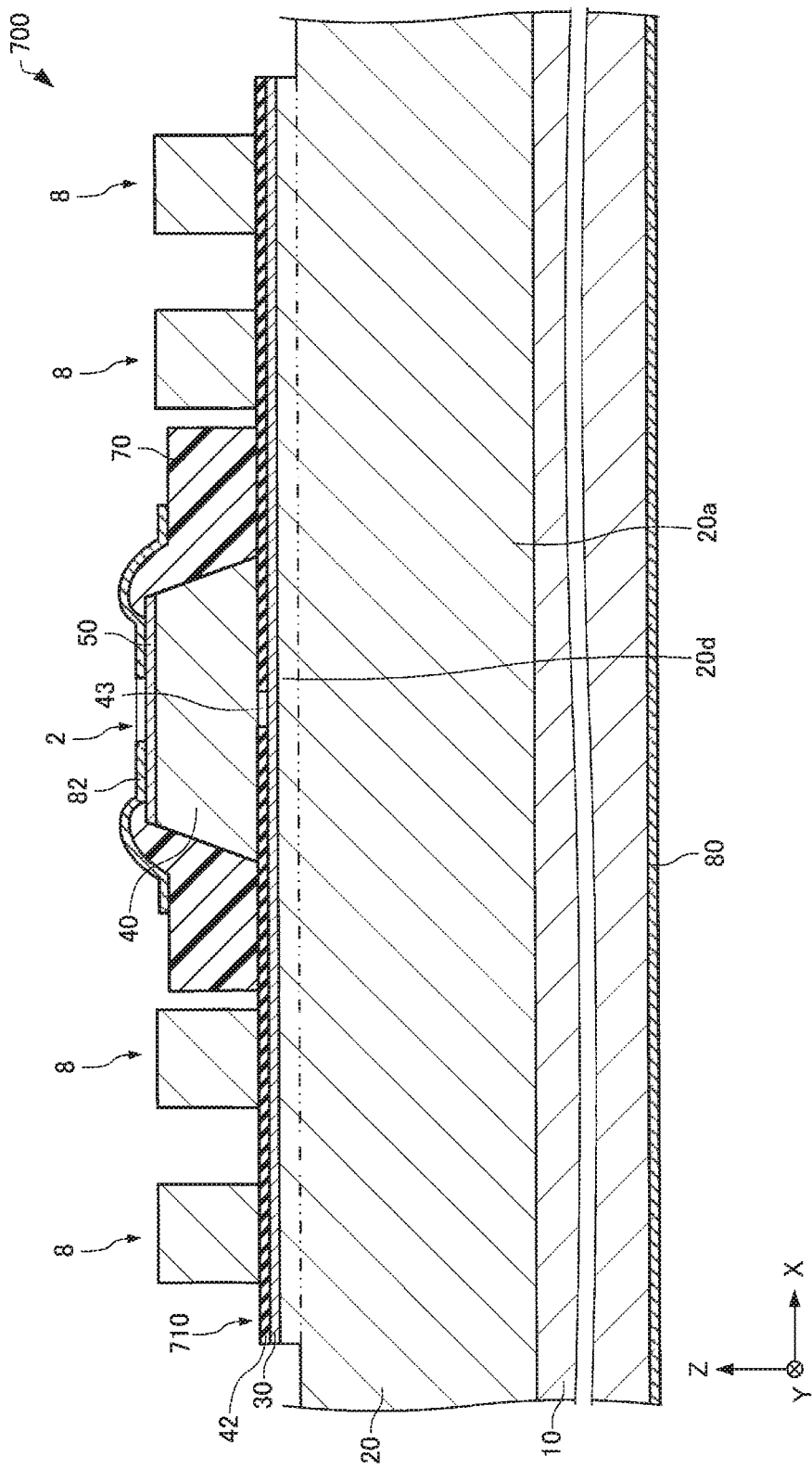
FIG. 21 is a sectional view schematically showing the surface emitting laser according to the sixth modified example.

FIG. 20 is a plan view schematically showing a surface emitting laser 700 according to a sixth modified example. FIG. 21 is a sectional view along line XXI-XXI in FIG. 20 schematically showing the surface emitting laser 700 according to the sixth modified example.

In the above described surface emitting laser 100, as shown in FIGS. 1 and 2, the second distortion appliers 8 are apart from the stacked structure 2.

On the other hand, in the surface emitting laser 700 according to the sixth modified example, as shown in FIGS. 20 and 21, the second distortion applier 8 and the stacked structure 2 are connected via a heat conductor 710.

Two of the heat conductors 710 are provided in the illustrated example. One heat conductor 710 extends from the stacked structure 2 (resonator 6) in the −X-axis direction and is connected to the two second distortion appliers 8 provided in the first region 10a. Further, the other heat conductor 710 extends from the stacked structure 2 (resonator 6) in the +X-axis direction and is connected to the two second distortion appliers 8 provided in the second region 10b. The heat conductor 710 connects the stacked structure 2 and the second distortion applier 8 and connects the adjacent second distortion appliers 8.

The heat conductors 710 and the second distortion appliers 8 are symmetrically provided with respect to the virtual line A in the plan view.

The heat conductor 710 includes a fourth portion 20d of the first mirror layer 20, the active layer 30, and the current confinement layer 42. The fourth portion 20d of the first mirror layer 20 is provided on the first portion 20a of the first mirror layer 20 and forms the resonator 6, the second distortion appliers 8, and the heat conductors 710. The thermal conductivity of the heat conductor 710 is higher than e.g. the thermal conductivity of the substrate 10.

The height (the size in the Z-axis direction) of the heat conductor 710 is smaller than the height of the stacked structure 2 and the height of the second distortion applier 8. Thereby, the influence by distortion applied to the active layer 30 by the heat conductor 710 may be made smaller. The planar shape of the heat conductor 710 is a shape having a longitudinal direction in the X-axis direction, and the distortion applied to the active layer 30 by the heat conductor 710 has different anisotropy from that of the distortion applied to the active layer 30 by the first distortion applier 4 and the second distortion applier 8. Accordingly, it is desirable to make the influence by distortion applied to the active layer 30 by the heat conductor 710 smaller.

In the surface emitting laser 700, heat generated by the heat conductor 710 in the resonator 6 may be transferred to the second distortion applier 8. The heat transferred to the second distortion applier 8 is released in the second distortion applier 8. Therefore, in the surface emitting laser 700, temperature rise of the resonator 6 may be suppressed.

3.7. Seventh Modified Example

In the above described example of the surface emitting laser 100, the example in which the first mirror layer 20 and the second mirror layer 40 are the DBR layers each including the Al0.12Ga0.88As layer and the Al0.9Ga0.1As is explained, however, in the modified example, the DBR layers forming the first mirror layer 20 and the second mirror layer 40 may be formed using other semiconductor materials.

For example, the first mirror layer 20 and the second mirror layer 40 may be DBR layers each including an AlN layer and a GaN layer. In this case, a sapphire substrate may be used as the substrate 10. Here, the coefficient of linear expansion of the sapphire substrate is $7 \times 10^{-6}/K$. Further, the coefficient of linear expansion of AlN is 4.6×10−6/K. The coefficient of linear expansion of GaN is 5.6×10−6/K. Therefore, the coefficient of linear expansion of the first distortion applier 4 with respect to the coefficient of linear expansion of the substrate 10 is smaller. Similarly, the coefficient of linear expansion of the second distortion applier 8 with respect to the coefficient of linear expansion of the substrate 10 is smaller. Therefore, even when these materials are used, the second distortion applier 8 may apply distortion having the same anisotropy as that of the first distortion applier 4 to the active layer 30.

3.8. Eighth Modified Example

In the above described example of the surface emitting laser 100, the second distortion applier 8 includes the first mirror layer 20, the active layer 30, the second mirror layer 40, and the current confinement layer 42, and is formed using the same semiconductor materials as the materials forming the stacked structure 2.

On the other hand, in the modified example, the materials forming the second distortion applier 8 may be different from the materials forming the stacked structure 2 as long as the magnitude relationship of the coefficient of linear expansion of the second distortion applier 8 to the coefficient of linear expansion of the substrate 10 is the same as the magnitude relationship of the coefficient of linear expansion of the first distortion applier 4 to the coefficient of linear expansion of the substrate 10. For example, the second distortion applier 8 maybe formed using other materials (metal, resin, or the like) than the semiconductor materials.

4. Atomic Oscillator

Figure 22:
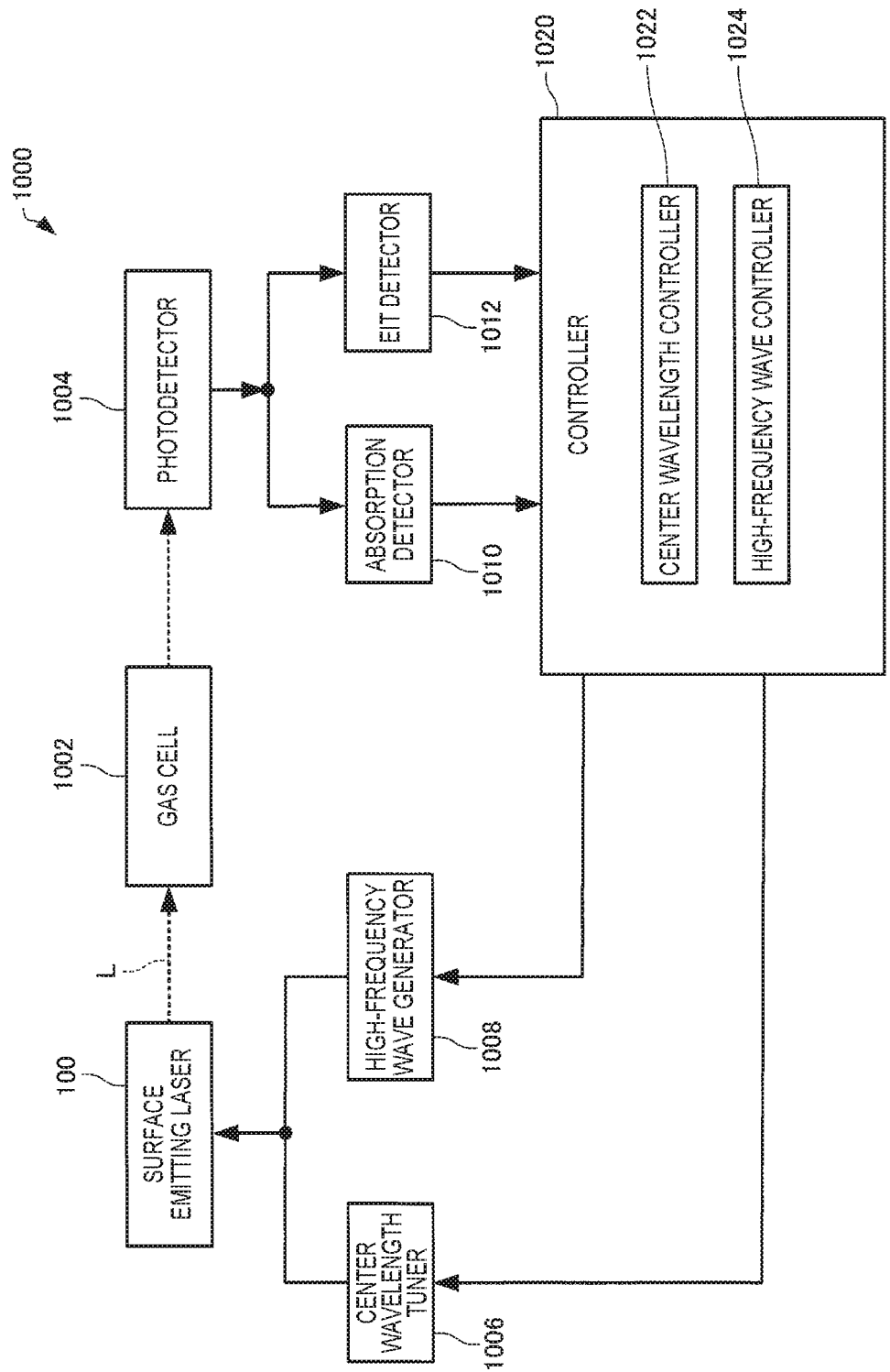
FIG. 22 is a functional block diagram showing an atomic oscillator according to an embodiment.

Next, an atomic oscillator according to an embodiment will be explained with reference to the drawings. FIG. 22 is a functional block diagram showing the atomic oscillator 1000 according to the embodiment.

As shown in FIG. 22, the atomic oscillator 1000 includes the surface emitting laser according to the invention (in the illustrated example, the surface emitting laser 100), a gas cell 1002, a photodetector 1004, a center wavelength tuner 1006, a high-frequency wave generator 1008, an absorption detector 1010, an EIT detector 1012, and a controller 1020. The controller 1020 has a center wavelength controller 1022 and a high-frequency wave controller 1024. The atomic oscillator 1000 generates an EIT phenomenon in alkali metal atoms using a resonance light pair (first light and second light) having two different frequency components.

The surface emitting laser 100 generates the first light and the second light having different frequencies from each other and irradiate the alkali metal atoms enclosed in the gas cell 1002.

Figure 23:
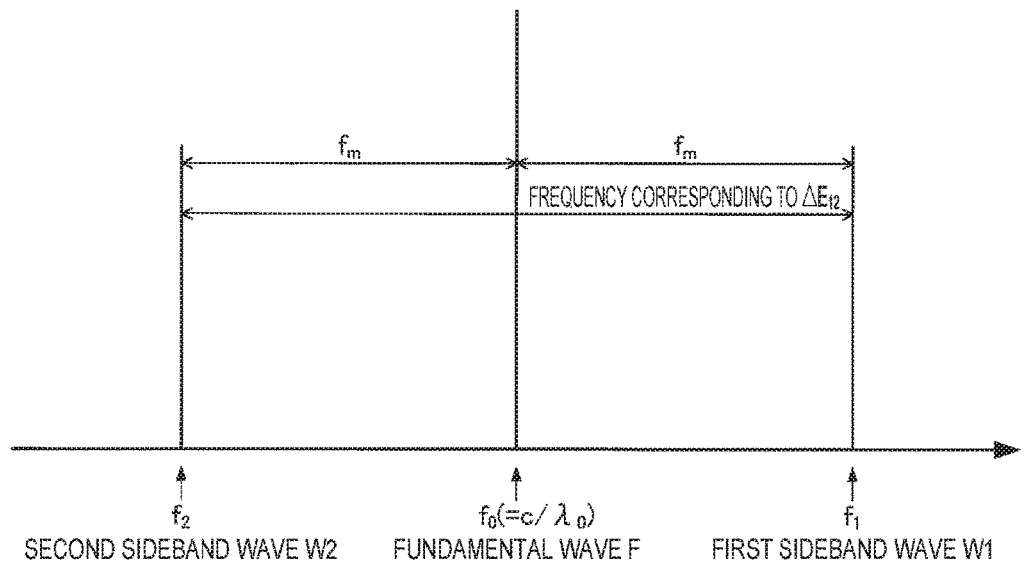
FIG. 23 shows a frequency spectrum of resonance light.
Figure 24:
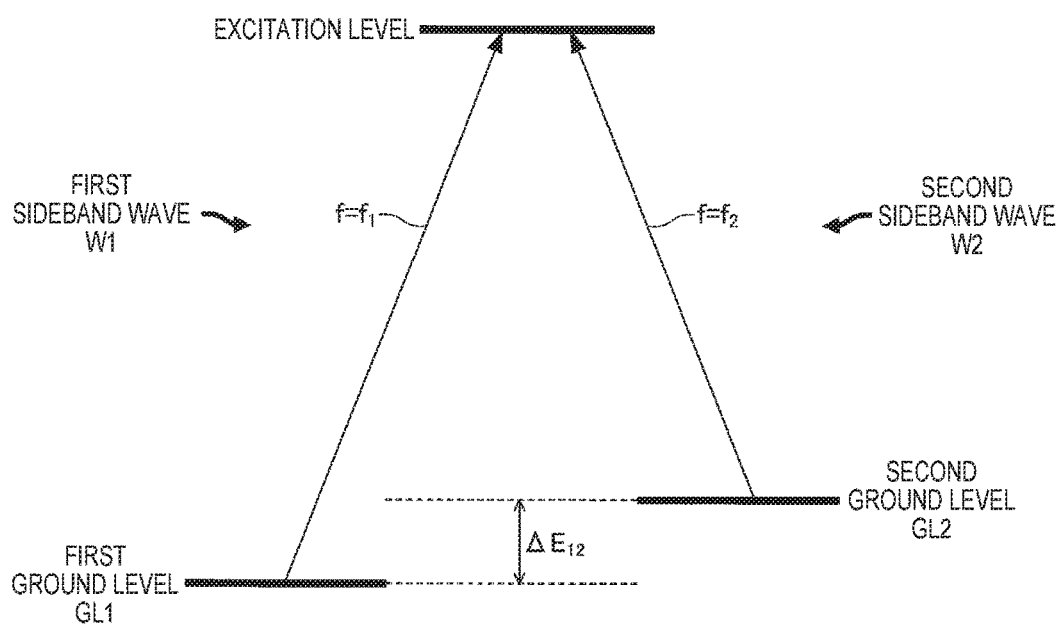
FIG. 24 shows a relationship between a Λ-type three-level model of an alkali metal atom and a first sideband wave and a second sideband wave.

Here, FIG. 23 shows a frequency spectrum of resonance light. FIG. 24 shows a relationship between a Λ-type three-level model of an alkali metal atom and a first sideband wave (first light) W1 and a second sideband wave (second light) W2. Light L output from the surface emitting laser 100 contains fundamental wave F having a center frequency f0 (=c/λ0: c is the speed of light, λ0 is center wavelength of the laser beam), first sideband wave W1 having a frequency f1 in the upper sideband with respect to the center frequency f0, and second sideband wave W2 having a frequency f2 in the lower sideband with respect to the center frequency f0 shown in FIG. 23. The frequency f1 of the first sideband wave W1 is f1=f0+fm and the frequency f2 of the second sideband wave W2 is f2=f0−fm.

As shown in FIG. 24, the frequency difference between the frequency f1 of the first sideband wave W1 and the frequency f2 of the second sideband wave W2 is equal to the frequency corresponding to an energy difference ΔE12 between the first ground level GL1 and the second ground level GL2 of the alkali metal atom. Therefore, the alkali metal atom causes the EIT phenomenon by the first sideband wave W1 having the frequency f1 and the second sideband wave W2 having the frequency f2.

Here, the EIT phenomenon is explained. It is known that the interaction between the alkali metal atom and light may be explained using a Λ-type three-level model. As shown in FIG. 24, the alkali metal atom has two ground levels and, when the first sideband wave W1 having the wavelength (frequency f1) corresponding to the energy difference between the first ground level GL1 and the excitation level or the second sideband wave W2 having the wavelength (frequency f2) corresponding to the energy difference between the second ground level GL2 and the excitation level is respectively singly applied to the alkali metal atom, light absorption occurs. However, as shown in FIG. 23, when the first sideband wave W1 and the second sideband wave W2 having the frequencies such that the frequency difference f2−f1 is accurately equal to the frequency corresponding to the energy difference ΔE12 between the first ground level GL1 and the second ground level GL2 are applied to the alkali metal atom at the same time, a superposition state of two ground levels, i.e., a quantum interference state is caused, and transparency (EIT phenomenon) that excitation to the excitation level stops and the first sideband wave W1 and the second sideband wave W2 are transmitted through the alkali metal atom occurs. Using the EIT phenomenon, an acute change of the light absorption behavior when the frequency difference f1−f2 between the first sideband wave W1 and the second sideband wave W2 shifts from the frequency corresponding to the energy difference ΔE12 between the first ground level GL1 and the second ground level GL2 is detected and controlled, and thereby, a high-accuracy oscillator may be formed.

The gas cell 1002 encloses gaseous alkali metal atoms (sodium atoms, rubidium atoms, cesium atoms, or the like) in a container. For example, the cesium atoms are heated at about 80° C. into a gaseous state. When two light waves (first light and second light) having the frequency (wavelength) corresponding to the energy difference between the two ground levels of the alkali metal atom are applied to the gas cell 1002, the alkali metal atoms causes the EIT phenomenon. For example, when the alkali metal atoms are cesium atoms, the frequency corresponding to the energy difference between the first ground level GL1 and the second ground level GL2 on the D1 line is 9.19263 . . . GHz, and, when two light waves at 9.19263 . . . GHz are applied, the EIT phenomenon occurs.

The photodetector 1004 detects the amount (intensity) of light transmitted through the gas cell 1002 (transmitted through the alkali metal atoms enclosed in the gas cell 1002). The photodetector 1004 outputs a detection signal according to the amount of light transmitted through the alkali metal atoms. As the photodetector 1004, e.g. a photodiode is used.

The center wavelength tuner 1006 applies a voltage between the electrodes 80, 82 (see FIG. 1) of the surface emitting laser 100 to inject a current to the active layer 30 based on the signal from the center wavelength controller 1022 and changes the center wavelength of the light L output from the surface emitting laser 100. Thereby, the center wavelength of the resonance light pair (first light and second light) contained in the light L may be changed. The center wavelength tuner 1006 may include a power supply that applies a voltage between the electrodes 80, 82.

The high-frequency wave generator 1008 supplies a high-frequency signal between the electrodes 80, 82 of the surface emitting laser 100 and generates a resonance pair based on the signal from the high-frequency wave controller 1024. The high-frequency wave generator 1008 may be realized by a dedicated circuit.

The absorption detector 1010 detects e.g. the minimum value (bottom of absorption) of the signal intensity of the detection signal output by the photodetector 1004 when the center wavelength of the light L is changed. The absorption detector 1010 may be realized by a dedicated circuit.

The EIT detector 1012 detects the EIT phenomenon by synchronous detection of the detection signal output by the photodetector 1004. The EIT detector 1012 may be realized by a dedicated circuit.

The center wavelength controller 1022 controls the center wavelength tuner 1006 based on the signal from the absorption detector 1010, and thereby, controls the current injected to the active layer 30 (see FIG. 2) of the surface emitting laser 100 and changes the light output (amount of light) and the wavelength (center wavelength) of the light L output from the surface emitting laser 100.

The high-frequency wave controller 1024 inputs a signal for generating the high-frequency signal to the high-frequency wave generator 1008 based on the signal from the EIT detector 1012.

Note that the controller 1020 may be realized by a dedicated circuit and adapted to perform the above described control. Further, the controller 1020 may function as a computer by executing control programs stored in e.g. a CPU (Central Processing Unit), ROM (Read Only Memory), RAM (Random Access Memory), or the like and adapted to perform the above described control.

Next, the operation of the atomic oscillator 1000 will be explained. First, the initial operation to activate the atomic oscillator 1000 in the halt state will be explained.

The high-frequency wave controller 1024 inputs a signal to the high-frequency wave generator 1008, and a high-frequency signal is input from the high-frequency wave generator 1008 to the surface emitting laser 100. In this regard, the frequency of the high-frequency signal is shifted so that the EIT phenomenon may not occur. For example, when cesium is used as the alkali metal atoms of the gas cell 1002, the frequency is shifted from the value of 4.596 . . . GHz.

Then, the center wavelength controller 1022 controls the center wavelength tuner 1006 to sweep the center wavelength of the light L. In this regard, the frequency of the high-frequency signal is set so that the EIT phenomenon may not occur, and thereby, the EIT phenomenon does not occur. The absorption detector 1010 detects the minimum value (bottom of absorption) of the intensity of the detection signal output in the photodetector 1004 when the center wavelength of the light L is swept. For example, the absorption detector 1010 regards a part in which the intensity change of the detection signal with respect to the center wavelength of the light L is constant as the bottom of absorption.

When the absorption detector 1010 detects the bottom of absorption, the center wavelength controller 1022 controls the center wavelength tuner 1006 to fix (lock) the center wavelength. That is, the center wavelength controller 1022 fixes the center wavelength of the light L to a wavelength corresponding to the bottom of absorption.

Then, the high-frequency wave controller 1024 controls the high-frequency wave generator 1008 to adjust the frequency of the high-frequency signal to the frequency at which the EIT phenomenon occurs. Then, the controller moves to a loop operation and the EIT signal is detected by the EIT detector 1012.

Next, the loop operation of the atomic oscillator 1000 will be explained.

The EIT detector 1012 performs synchronous detection of the detection signal output by the photodetector 1004, and the high-frequency wave controller 1024 controls the frequency of the high-frequency signal generated by the high-frequency wave generator 1008 to be a frequency corresponding to a half of $\Delta E12$ of the alkali metal atom of the gas cell 1002 based on the signal input from the EIT detector 1012.

The absorption detector 1010 performs synchronous detection of the detection signal output by the photodetector 1004, and the center wavelength controller 1022 controls the center wavelength tuner 1006 so that the center wavelength of the light L may be a wavelength corresponding to the minimum value (bottom of absorption) of the intensity of the detection signal output in the photodetector 1004 based on the signal input from the absorption detector 1010.

The atomic oscillator 1000 includes the surface emitting laser 100, and thereby, may use the surface emitting laser that can output a laser beam in the stable polarization direction as a light source. Accordingly, for example, the circularly-polarized light may be stably applied to the gas cell 1002 via a quarter-wave plate. As a result, frequency stability of the atomic oscillator may be improved. For example, there are cases where the polarization direction of the laser beam output from the surface emitting laser is unstable, the light obtained via the quarter-wave plate is elliptically-polarized light, and the rotation direction of the circularly-polarized light varies.

Note that the above described embodiments and modified examples are just examples, but the invention is not limited to those. For example, the respective embodiments and respective modified examples can be appropriately combined.

The invention includes substantially the same configurations (e.g. configuration having the same functions, methods, and results or configurations having the same purposes and advantages) as the configurations explained in the embodiments. Further, the invention includes configurations in which inessential parts of the configurations explained in the embodiments are replaced. Furthermore, the invention includes configurations that exert the same effects or may achieve the same purposes as those of the configurations explained in the embodiments. In addition, the invention includes configurations in which known technologies are added to the configurations explained in the embodiments.

What is claimed is:
1. A surface emitting laser comprising:
a substrate;
a stacked structure provided on the substrate and including a first mirror layer, a second mirror layer, and an active layer provided between the first mirror layer and the second mirror layer, and including a resonator that resonates light generated in the active layer and a first distortion applier connected to the resonator and applying distortion to the active layer; and
a second distortion applier provided on the substrate and applying distortion to the active layer,
wherein, as seen from a stacking direction of the first mirror layer and the active layer, the first distortion applier includes a first portion and a second portion provided with the resonator in between, as seen from the stacking direction, a longitudinal direction of the second distortion applier and a longitudinal direction of the first distortion applier are the same direction, and a magnitude relationship of a linear expansion coefficient of the second distortion applier to a linear expansion coefficient of the substrate is the same as a magnitude relationship of a linear expansion coefficient of the first distortion applier to the linear expansion coefficient of the substrate.

2. The surface emitting laser according to claim 1, wherein the second distortion applier is apart from the stacked structure.

3. The surface emitting laser according to claim 1, comprising a plurality of the second distortion appliers.

4. The surface emitting laser according to claim 3, wherein, as seen from the stacking direction, the plurality of second distortion appliers are arranged in a direction orthogonal to the longitudinal direction of the first distortion applier.

5. The surface emitting laser according to claim 3, wherein, as seen from the stacking direction, when the substrate is divided into a first region and a second region at a boundary of a virtual line passing through a center of the resonator and extending in the longitudinal direction of the first distortion applier, at least one of the plurality of second distortion appliers is located in the first region and at least another one of the plurality of second distortion appliers is located in the second region.

6. The surface emitting laser according to claim 5, wherein a number of the second distortion appliers located in the first region and a number of the second distortion appliers located in the second region are equal.

7. The surface emitting laser according to claim 1, wherein, as seen from the stacking direction, a distance between the second distortion applier and an end portion of the substrate in the direction orthogonal to the longitudinal direction of the first distortion applier is smaller than a distance between the second distortion applier and the stacked structure.

8. The surface emitting laser according to claim 1, wherein, in the stacking direction, a height of the second distortion applier is larger than a height of the resonator.

9. The surface emitting laser according to claim 1, wherein the linear expansion coefficient of the second distortion applier is smaller than the linear expansion coefficient of the substrate and the linear expansion coefficient of the first distortion applier is smaller than the linear expansion coefficient of the substrate.

10. The surface emitting laser according to claim 1, wherein the linear expansion coefficient of the second distortion applier is larger than the coefficient linear expansion of the substrate and the linear expansion coefficient of the first distortion applier is larger than the linear expansion coefficient of the substrate.

11. An atomic oscillator comprising a surface emitting laser including:

a substrate;

a stacked structure provided on the substrate and including a first mirror layer, a second mirror layer, and an active layer provided between the first mirror layer and the second mirror layer, and including a resonator that resonates light generated in the active layer and a first distortion applier connected to the resonator and applying distortion to the active layer; and a second distortion applier provided on the substrate and applying distortion to the active layer, wherein, as seen from a stacking direction of the first mirror layer and the active layer, the first distortion applier includes a first portion and a second portion provided with the resonator in between, as seen from the stacking direction, a longitudinal direction of the second distortion applier and a longitudinal direction of the first distortion applier are the same direction, and a magnitude relationship of a linear expansion coefficient of the second distortion applier to a linear expansion coefficient of the substrate is the same as a magnitude relationship of a linear expansion coefficient of the first distortion applier to the linear expansion coefficient of the substrate.

\* \* \* \* \*